United States Patent
Hachuda et al.

(10) Patent No.: US 6,966,783 B2
(45) Date of Patent: Nov. 22, 2005

(54) CONTACT PIN AND SOCKET FOR ELECTRICAL PARTS PROVIDED WITH CONTACT PIN

(75) Inventors: Osamu Hachuda, Kawaguchi (JP); Naoaki Takayama, Kawaguchi (JP); Ryoji Maruyama, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/615,027

(22) Filed: Jul. 9, 2003

(65) Prior Publication Data

US 2004/0029412 A1    Feb. 12, 2004

(30) Foreign Application Priority Data

Jul. 9, 2002  (JP) ............................... 2002-199980
Jul. 9, 2002  (JP) ............................... 2002-199981

(51) Int. Cl.[7] ........................................... H01R 12/00
(52) U.S. Cl. ....................................... 439/66; 439/700
(58) Field of Search ............................. 439/66, 73, 71, 439/75, 70, 331, 525, 526, 700, 816–818, 439/259–261, 295, 824

(56) References Cited

U.S. PATENT DOCUMENTS

| | | | | |
|---|---|---|---|---|
| 6,270,356 | B1 * | 8/2001 | Hoshino et al. | 439/70 |
| 6,296,505 | B1 * | 10/2001 | Fukunaga et al. | 439/268 |
| 6,416,331 | B1 * | 7/2002 | Shimizu | 439/66 |
| 6,464,511 | B1 * | 10/2002 | Watanabe et al. | 439/66 |
| 6,503,089 | B2 * | 1/2003 | Saijo et al. | 439/70 |
| 6,743,043 | B2 * | 6/2004 | Yamada | 439/482 |

\* cited by examiner

Primary Examiner—P. Austin Bradley
Assistant Examiner—Phuongchi Nguyen
(74) Attorney, Agent, or Firm—Staas & Halsey LLP

(57) ABSTRACT

A contact pin comprises a plunger contacting an electric part, a bottom contact portion electrically connected to a printed circuit board, and a spring urging the plunger and the bottom contact portion so as to separate from each other, in which at least one of the plunger and the bottom contact portion is formed by press-working a plate member. The bottom contact portion is provided with a connection portion to which the plunger is connected.

18 Claims, 24 Drawing Sheets

FIG.10A
FIG.10B
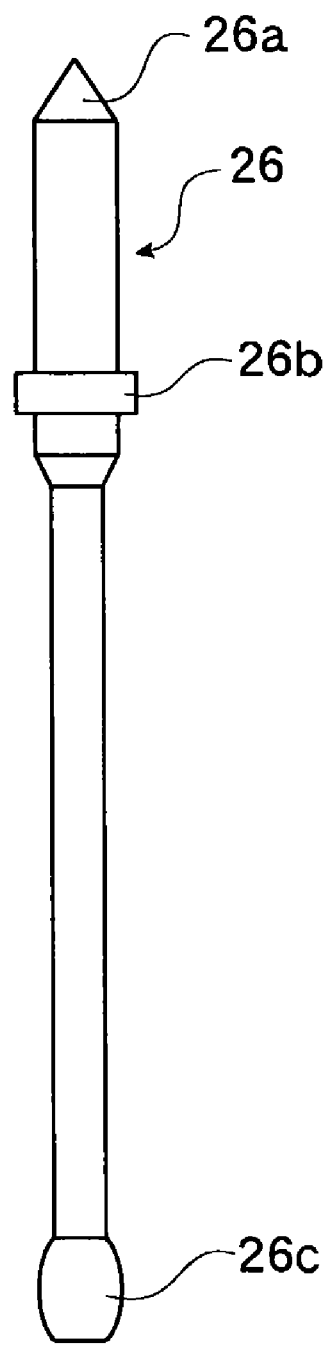
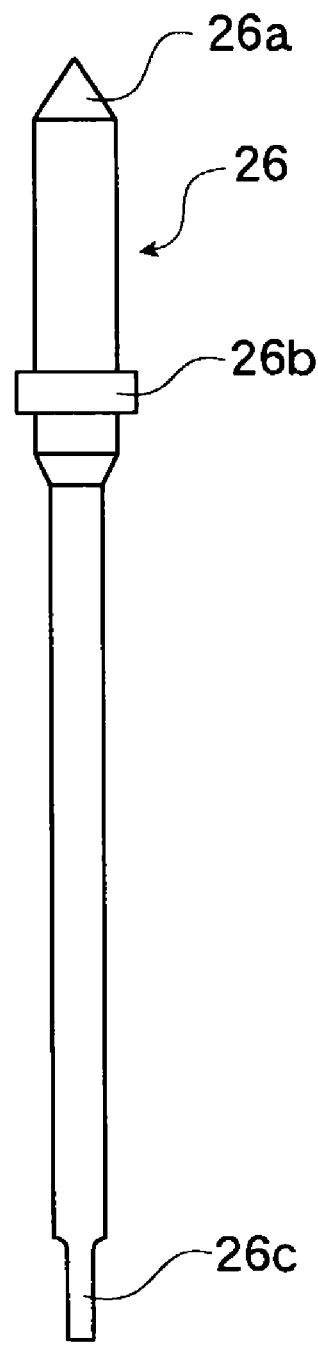

CONTACT PIN AND SOCKET FOR ELECTRICAL PARTS PROVIDED WITH CONTACT PIN

BACKGROUND OF THE INVENTION

1. Field of the Invention

The present invention relates to a contact pin arranged to a socket for an electrical part for detachably holding an electrical part such as semiconductor device so as to be electrically connected to the electrical part and also relates to a socket for electrical part provided with such contact pin.

2. Related Art

In prior art, there is known an IC socket, as a "socket for an electrical part", for detachably holding an IC package as "electrical part".

Such IC package includes BGA (Ball Grid Array) type or LGA (Land Grid Array) type, in which a number of terminals are arranged to a lower surface of an IC package body having rectangular shape.

On the other hand, the IC socket has a socket body to which a number of contact pins of surface-press-contact type structure are arranged, through which a printed circuit board and the IC package terminals are electrically connected.

The contact pin has a tubular portion, in which a lower contacting section press-contacted to the printed circuit board is accommodated in a lower portion of the tubular portion to be vertically movable and an upper contacting section press-contacted to the terminal of the IC package is also accommodated in an upper portion of the tubular portion to be vertically movable. A spring is further accommodated in the tubular portion to a position between the lower and upper contacting sections so as to urge these contacting sections in opposing directions.

In a state that the IC socket is secured onto the printed circuit board, the lower contacting section of the contact pin is urged by the spring to thereby press-contact the printed circuit board. From this state, the IC package is mounted and accommodated on the socket body and is then pressed from the upper side thereof. Thus, the spring is compressed and, according to the urging force of this spring, the upper contacting section is press-contacted to the terminal of the IC package at a predetermined pressure.

The contact pin of the conventional structure mentioned above is, however, composed of many (four) portions of the tubular portion, the lower contacting section, the upper contacting section and the spring, so that assembling process is increased, and moreover, it is troublesome to manufacture the tubular portion having a hollow structure, involving much cost, thus being inconvenient.

In addition, in the conventional structure, a number of such contact pins are arranged in conformity with the arrangement of the terminals of the IC package, and in a case if the arrangement of the contact pins differs from that of the terminals of the IC package to be inspected, it is required to be changed with another IC socket having an arrangement of contact pins corresponding to the arrangement of the IC package terminal, thus being also inconvenient.

SUMMARY OF THE INVENTION

An object of the present invention is to substantially eliminate defects or drawbacks encountered in the prior art mentioned above and to provide a contact pin for a socket for electrical parts which can be easily produced with a reduced number of components.

Another object of the present invention is to provide a socket for electrical parts, provided with such contact pins mentioned above, easily applicable to terminal arrangement pattern of the electrical part without changing an entire component of the socket.

These and other objects can be achieved according to the present invention by providing, in one aspect, a contact pin mounted to a socket body into which an electrical part is accommodated and adapted to electrically connect a terminal of the electrical part to a printed circuit board, the contact pin comprising:

a plunger electrically contacting the electrical part;

a bottom contact portion electrically connected to the printed circuit board; and a spring urging the plunger and the bottom contact portion so as to separate from each other;

wherein at least one of the plunger and the bottom contact portion is formed by press-working a plate member and one of the plunger and the bottom contact portion is provided with a connection portion to which the other one thereof is connected to be relatively movable.

In preferred embodiments of this aspect, the other one of the plunger and the bottom contact portion is a plunger having a rod-shaped portion which is formed to be relatively slidable to the connection portion of the bottom contact portion. Furthermore, the one of the plunger and the bottom contact portion is a bottom contact portion having the connection portion of tubular structure positioned on an upper side of the plunger, and the bottom contact portion has a lower contact portion having a center line in alignment with a center line of the plunger.

The other one of the plunger and the bottom contact portion has a portion projecting through the connection portion and a coming-off prevention portion is provided for the projected portion. The one of the plunger and the bottom contact portion is the bottom contact portion provided with the connection portion and the other one of the plunger and the bottom contact portion is the plunger having a flanged portion, and the spring is disposed between the flanged portion of the plunger and the connection portion of the bottom contact portion. At least one of the flanged portion and connection portion has an inclined surface which contacts the spring.

In another aspect of the present invention, there is also provided a socket for an electrical part having a socket body to which the contact pin of the structure and character mentioned above is arranged, wherein the socket body has an upper portion to which a top plate is disposed and a lower portion to which a bottom plate is disposed, the plunger of the contact pin has a flanged portion which is inserted through the top plate to be vertically movable and the bottom contact portion is inserted through the bottom plate.

In this aspect, the plunger has an upper coming-off prevention portion which abuts against a lower surface of the top plate and the bottom contact portion has a lower coming-off prevention portion which abuts against an upper surface of the bottom plate to thereby restrict the vertical movement of the contact pin.

A middle plate is further arranged between the top plate and the bottom plate, and the connection portion is inserted and guided through the middle plate so as to be vertically movable. The bottom contact portion is formed with a connection portion, to which an engaging piece is formed so as to limit an upward movement of the bottom contact portion in engagement with a lower surface of the middle plate.

According to the characters and structures of the above one and another aspect of the present invention, the contact pin comprises a plunger electrically contacting the electrical part, a bottom contact portion electrically connected to the printed circuit board, and a spring urging the plunger and the bottom contact portion so as to separate from each other. Thus, the contact pin is composed of three parts or elements, reducing the number of constitutional elements. In addition, at least one of the plunger and the bottom contact portion is formed by press-working a plate member, and one of the plunger and the bottom contact portion is provided with a connection portion to which the other one thereof is connected to be relatively movable. Accordingly, it is not necessary as in the prior art to form a tubular or like member, thus enabling easy manufacture of the contact pin with reduced cost.

The plunger may be formed with a rod-shaped portion so that the cutting or grinding working can be easily done as in the conventional technology for forming a tubular structure.

Since the bottom contact portion is provided with the connection portion having a tubular section and the bottom contact portion has a lower contact portion having a center line in alignment with a center line of the plunger, respective through holes formed to the plate members of a socket body may be formed on one straight line, whereby the respective plates of the contact pin assembly can be easily assembled and arranged. Moreover, since the reactive force from the electrical part and from the printed circuit board act on the same center line, the relative movement of the plunger and the bottom contact portion of the contact pin can be smooth.

The formation of the coming-off prevention portion to the plunger from the connection portion of the bottom contact portion makes it possible to easily handle the socket without disassembling the same.

In addition, according to the socket of the above aspect, the respective top, middle and bottom plates are provided for the socket body so that the plunger of the contact pin has a flanged portion which is inserted through the top plate to be vertically movable and the bottom contact portion is inserted through the bottom plate. Thus, the contact pin can be easily arranged and held between the top plate and the bottom plate.

Moreover, the formation of the upper coming-off prevention portion and lower coming-off prevention portion makes it possible to safely hold the contact pin between the top plate and the bottom plate of the contact pin assembly, and the assembling or exchanging of the contact pin can be easily done merely by removing either one of the top plate or bottom plate. Still furthermore, the formation of the middle plate between the top and bottom plates can prevent the contact pin from being bent or broken at its intermediate portion.

In addition, the rising of the contact pin can be restricted by the middle plate to thereby prevent the application of a strong force to the top plate, thus making thin the top plate.

Furthermore, contacting state of the bottom contact portion and the printed circuit board can be maintained to thereby prevent any dirt or dust from intruding into a gap between the bottom contact portion and the printed circuit board, thus ensuring electrical conductivity.

In a further aspect, there is provided a socket for an electrical part having a socket body to which the electrical part is accommodated and to which a contact pin is arranged to electrically connect a terminal of the electrical part to a printed circuit board, the socket body is provided with a frame-shaped base member, a contact pin assembly, including the contact pin, mounted to be detachably thereto, and a lock means for securing the contact pin assembly to the base member, the lock means being operated from an upper side thereof.

In this aspect, the contact pin assembly includes a plurality of plates disposed vertically with a predetermined distance, the lock means is disposed between the vertically arranged plates and includes a lock member to be rotatable from the upper side thereof, the lock member is provided with an engagement piece projecting substantially horizontally, the engagement piece being engaged with an engaging portion formed to the base member when the lock member is rotated.

The contact pin assembly includes top, middle and bottom plates disposed vertically, the bottom and middle plates being arranged with a predetermined distance, the top plate being disposed to be vertically movable with respect to the middle plate and being urged upward. The middle plate is positioned in the vertical direction with respect to the base member.

According to the structure and character of this aspect, the socket body is provided with a frame-shaped base member, a contact pin assembly, and a lock means for securing the contact pin assembly to the base member, the lock means being operative from the upper side thereof. Therefore, the socket is applicable for electrical parts having various arrangement patterns of the terminals only by changing the contact pin assembly without changing the entire structure of the socket body. In addition, since the lock means can be handled from the upper portion, the contact pin assembly can be mounted or dismounted with the base member being mounted to the printed circuit board, thus improving the maneuverability of members or parts.

Moreover, the contact pin assembly includes top, middle and bottom plates disposed vertically, the bottom and middle plates being arranged with a predetermined distance, the top plate being disposed to be vertically movable with respect to the middle plate and being urged upward. The middle plate is positioned in the vertical direction with respect to the base member. Accordingly, at a time when the electrical part is accommodated on the top plate and then pressed downward, the top plate is lowered and the contact pin and the electrical part are contacted at a predetermined pressure, so that the top plate and the electrical part are both simultaneously lowered in a stable state, thus achieving the predetermined contacting pressure. On the other hand, in the structure in which the top plate is fixed, it is necessary to project the contact portion of the contact pin from the top plate by some length before the accommodation of the electrical part and to ensure the displacement amount of the contact portion to the upper surface of the top plate. According to such arrangement, the electrical part is placed on the number of contact pins, thus damaging the contact portions of the contact pins.

Furthermore, since the middle plate is positioned in the vertical direction with respect to the base member, the mounting performance in the vertical direction of the contact pin assembly with respect to the base member can be improved, and the distance between the top plate and the bottom plate of the contact pin assembly can be set to the constant value, and the height level of the upper surface of the top plate from the printed circuit board can be set constant, so that the pushing amount of the electrical part can be made constant and the contacting pressure can thus be made constant.

In a still further aspect, there is also provided a socket for an electrical part having a socket body to which the electrical part is accommodated and to which a contact pin is arranged to electrically connect a terminal of the electrical part to a printed circuit board, the socket body is provided with a frame-shaped base member, and a contact pin assembly, including the contact pin, mounted to be detachably thereto, the contact pin assembly being inserted, to be detachable, from an upper portion with respect to the base member.

The contact pin assembly is mounted to a predetermined position with respect to the printed circuit board and the base member is arranged to be horizontally adjustable in position with respect to the contact pin assembly.

According to this aspect, the socket is applicable for electrical parts having various arrangement patterns of the terminals only by changing the contact pin assembly without changing the entire structure of the socket body. In addition, since the contact pin assembly is inserted to be detachable from the upper portion with respect to the base member, the contact pin assembly can be mounted or dismounted with the state of the base member being mounted to the printed circuit board, thus making easy the exchanging working of parts or members.

In addition, since the contact pin assembly is mounted to the predetermined position with respect to the printed circuit board and the base member is arranged to be horizontally adjustable in position with respect to the contact pin assembly, a number of contact pins can be arranged to the predetermined positions, and accordingly, the contact pins can be connected to the predetermined electrodes. Moreover, even if the mounting position of the base member to the printed circuit board is slightly shifted, the base member and the contact pin assembly can be adjustable in positions, so that the base member can be surely mounted to the printed circuit board.

In a modified aspect of the present invention, there is also provided a socket for an electrical part for establishing an electrical connection between a terminal of the electrical part and a printed circuit board, comprising:

a socket body to which a number of contact pins are arranged;

a base member disposed to the socket body;

a contact pin assembly provided with the contact pin and secured to the base member by a lock means;

an open/close member arranged to the base member to be rotatable; and an operation member operating the open/close member to be rotatable, the contact pin assembly including a plurality of plates disposed vertically with a predetermined distance, and said contact pin comprising a plunger electrically contacting the electric part, a bottom contact portion electrically contacting the printed circuit board, and a spring urging the plunger and the bottom contact portion so as to separate from each other, in which at least one of the plunger and the bottom contact portion is formed by press-working a plate member, the bottom contact portion being provided with a connection portion to which the plunger is connected, and the plunger having a rod-shaped portion which is formed to be relatively slidable to the connection portion of the bottom contact portion.

According to the structure of this concrete aspect, almost the same functions and advantageous effects as mentioned above can be achieved.

The nature and further characteristic features of the present invention will be made more clear from the following descriptions made with reference to the accompanying drawings.

BRIEF DESCRIPTION OF THE DRAWINGS

In the accompanying drawings:

FIG. 9 illustrates the contact pin of the IC socket of the first embodiment, in which

FIG. 10 illustrates a plunger of the contact pin of FIG. 9, in which FIG. 10A is a front view thereof and FIG. 10B is a side view thereof;

FIG. 11 shows a bottom portion of the contact pin of FIG. 9, in which

FIG. 12 illustrates a top plate for a contact pin assembly, in which

FIG. 13 illustrates a middle plate for the contact pin assembly, in which

FIG. 14 illustrates a bottom plate for the contact pin assembly, in which

FIG. 16 shows the lock member, in which

FIG. 24 shows the IC package, in which

FIG. 26 shows a modification of an upper contact portion of the plunger of the contact pin of each embodiment, in which

FIG. 27 shows another modification of the upper contact portion of the plunger of the contact pin of each embodiment, in which

FIG. 28 shows a further modification of the upper contact portion of the plunger of the contact pin of each embodiment, in which

DESCRIPTION OF THE PREFERRED EMBODIMENTS

[First Embodiment 1]

Figure 1:
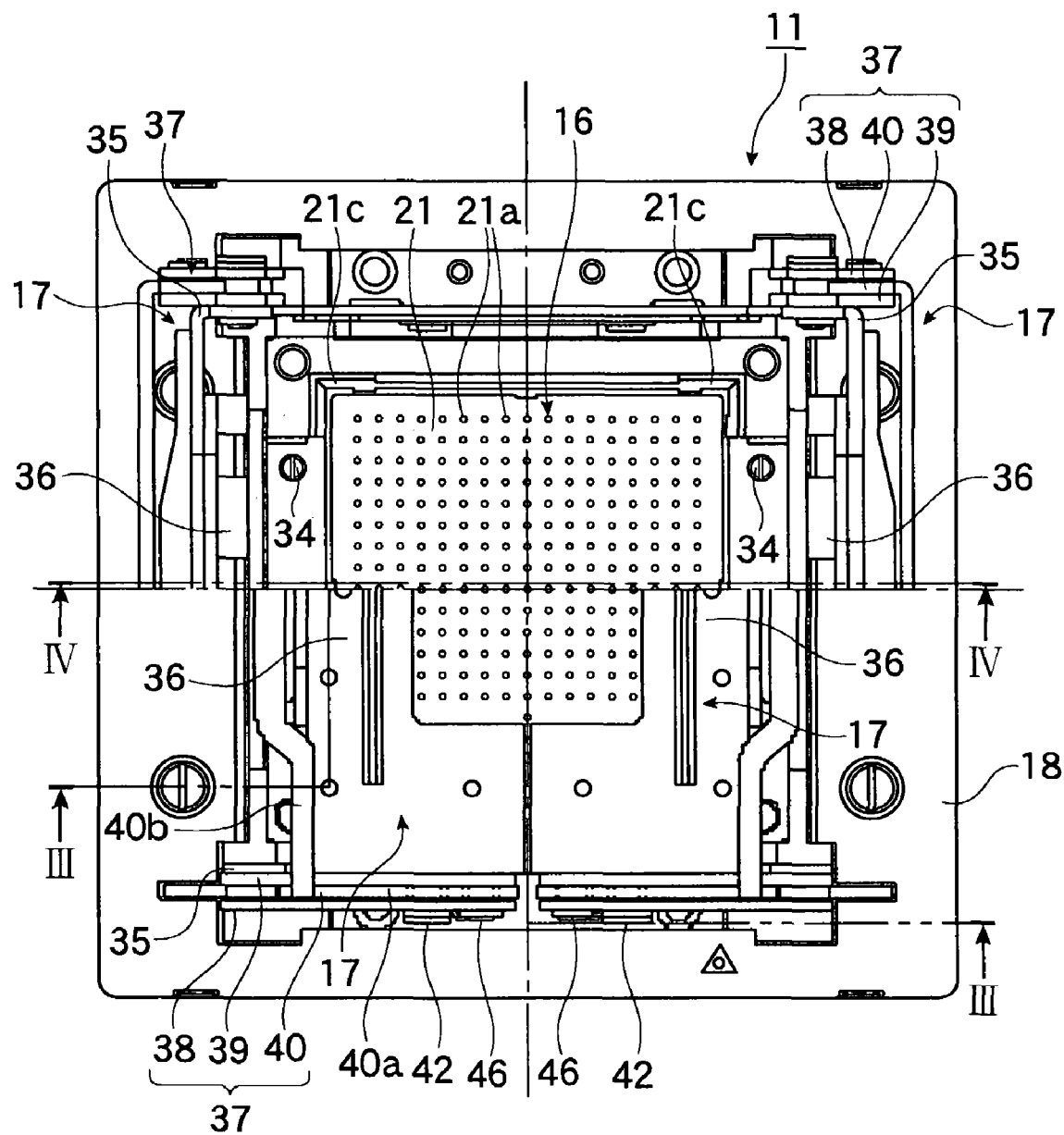
FIG. 1 is a plan view of an IC socket according to a first embodiment of the present invention, in which an open/close member is opened in an upper half and closed in a lower half.

The first embodiment of the present invention will be first described with reference to FIGS. 1 to 24. Further, it is to be noted that terms "upper", "lower", "right", "left" and the like are used herein with reference to the illustrated state or generally usable state of a socket for an electrical part.

With reference to these figures, reference numeral 11 designates an IC socket as open-top type socket for an electrical part, and this IC socket 11 is a member for establishing an electrical connection between a plate-shaped terminal 12b as a terminal of an IC package 12 as "electrical part" and a printed circuit board P of, for example, a measurement device such as tester.

Figure 24A:
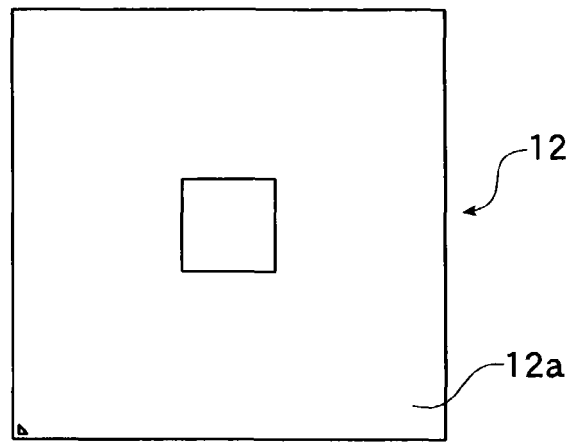
FIG. 24A is a plan view thereof.
Figure 24B:
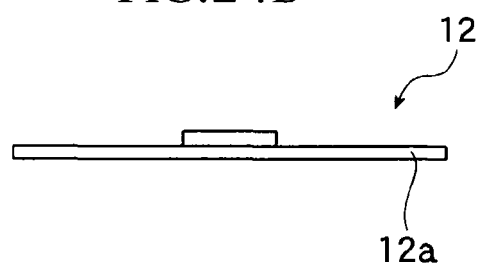
FIG. 24B is a front view thereof and FIG. 24C is a bottom view thereof.
Figure 24C:
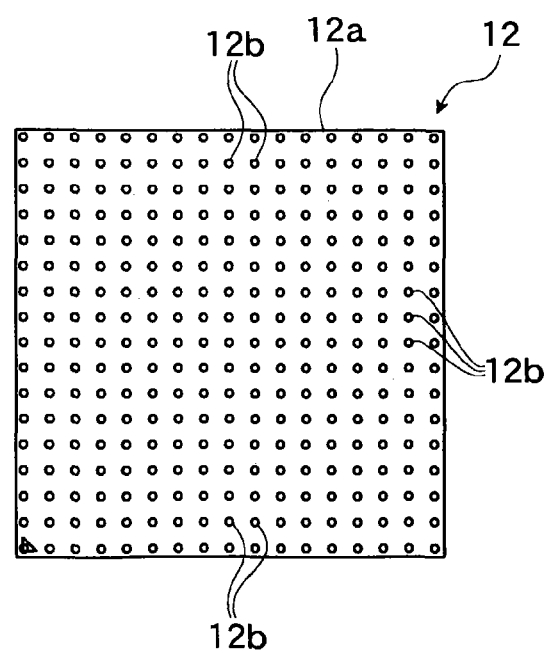

The IC package 12 is of so-called an LGA (Land Grid Array) type such as shown in FIG. 24 and has a rectangular package body 12a, and a number of plate-shaped terminals 12b are arranged to a lower surface of the package body 12a.

Figure 2:
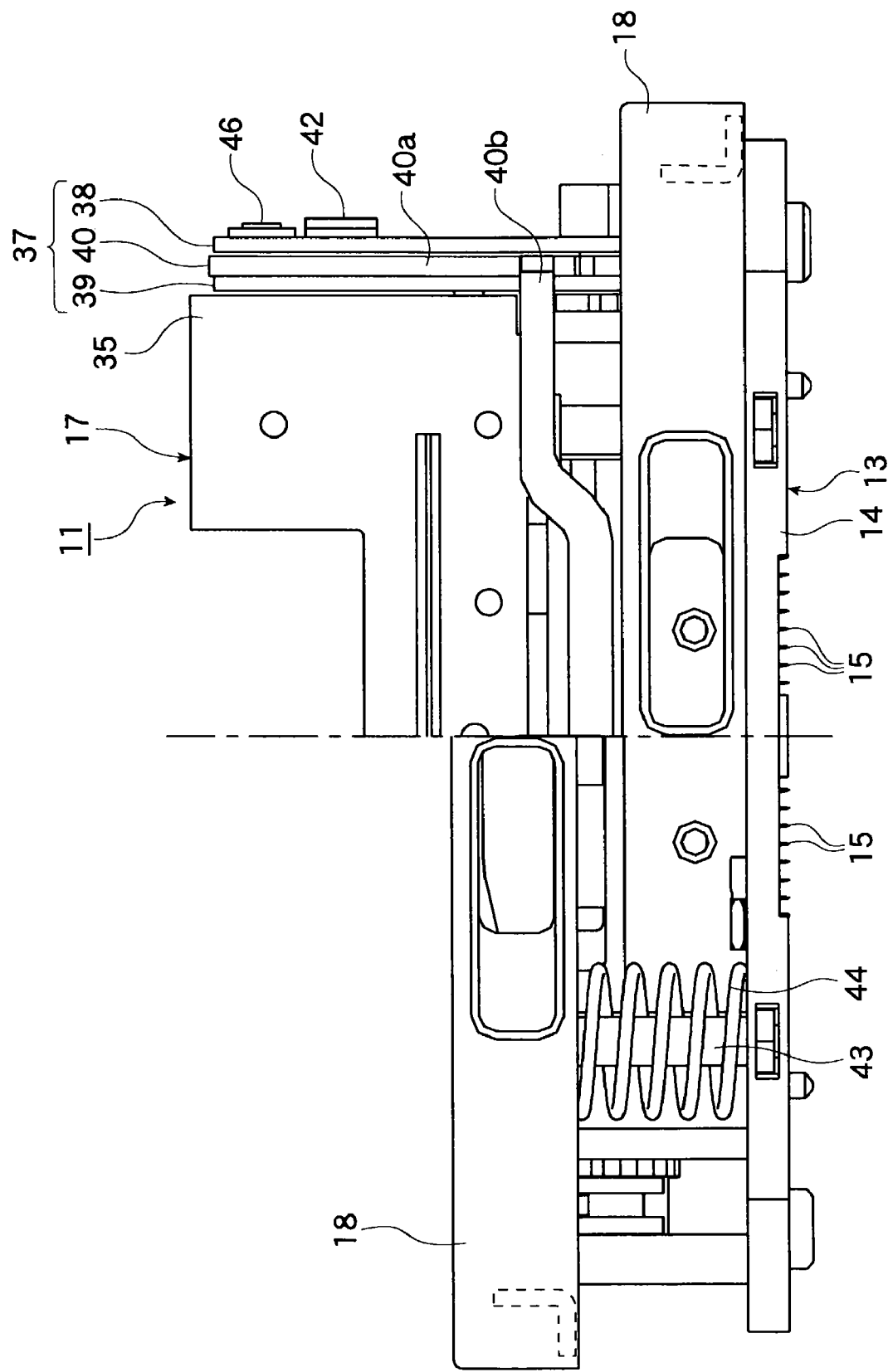
FIG. 2 is a right side view of FIG. 1.
Figure 3:
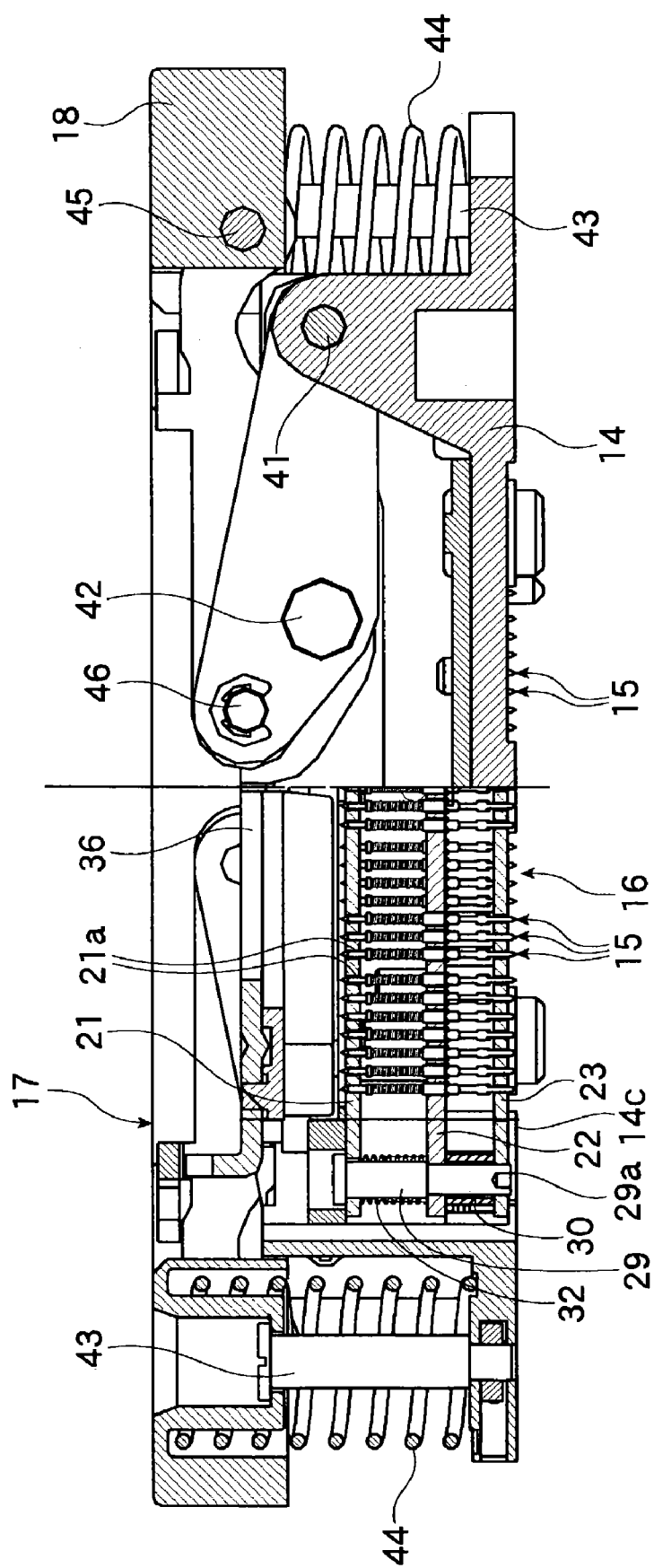
FIG. 3 is a sectional view taken along the line III—III in FIG. 1.
Figure 4:
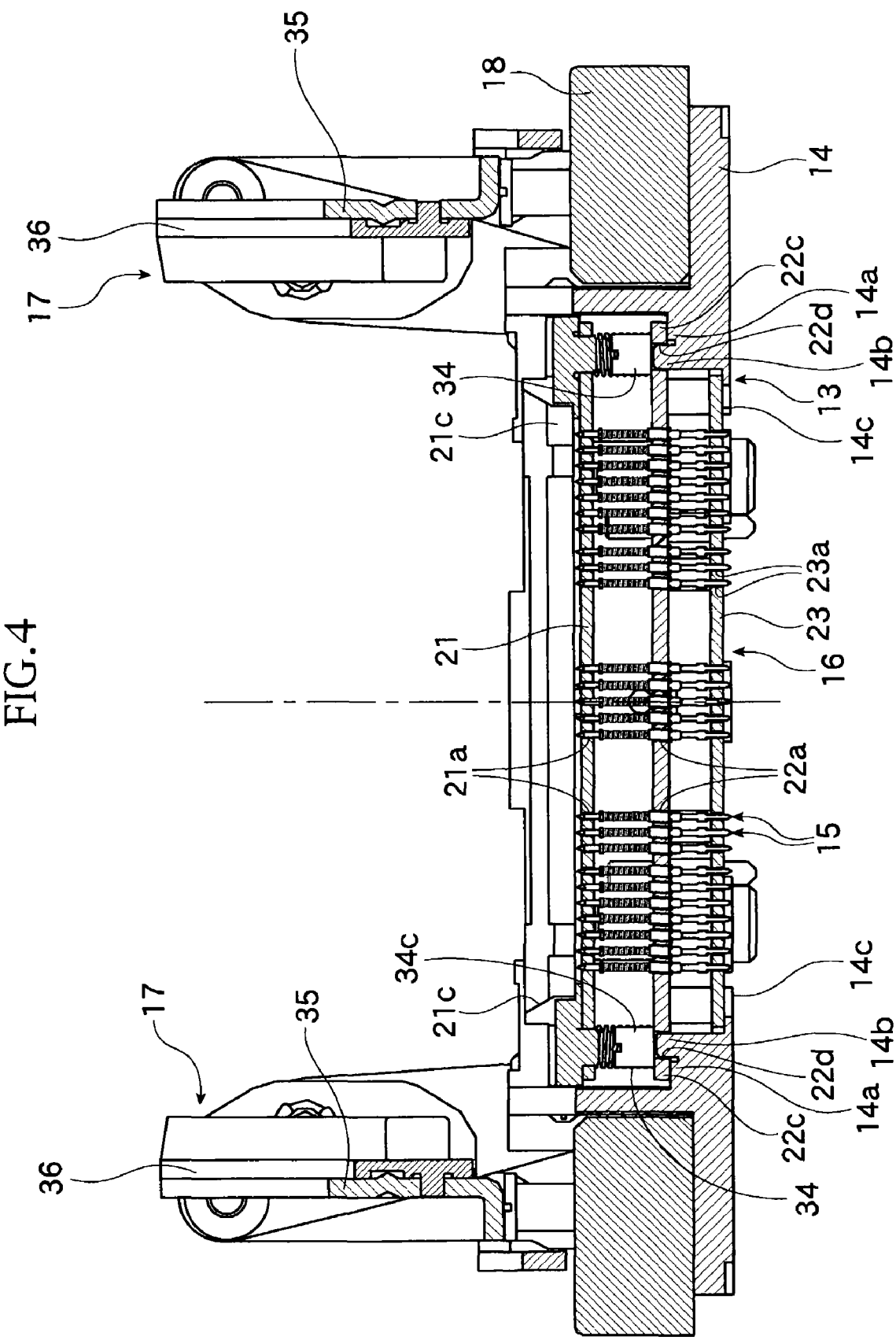
FIG. 4 is a sectional view taken along the line IV—IV in FIG. 1.

More specifically, the IC socket 11 has, as shown in FIGS. 2 to 4, a socket body 13 to be mounted to a printed circuit board P. The socket body 13 has a base member 14 to which a contact pin assembly 16, having a structure to which a number of surface-press-contact type contact pins 15 are supported and held, is arranged. An open/close member 17 (including a pair of open/close members) for pressing the IC package 12 is also mounted to the base member 14 to be rotatable (pivotal), and an operation member 18 for opening or closing the open/close member 17 is also arranged to the base member 14 of the socket body 13.

Figure 5:
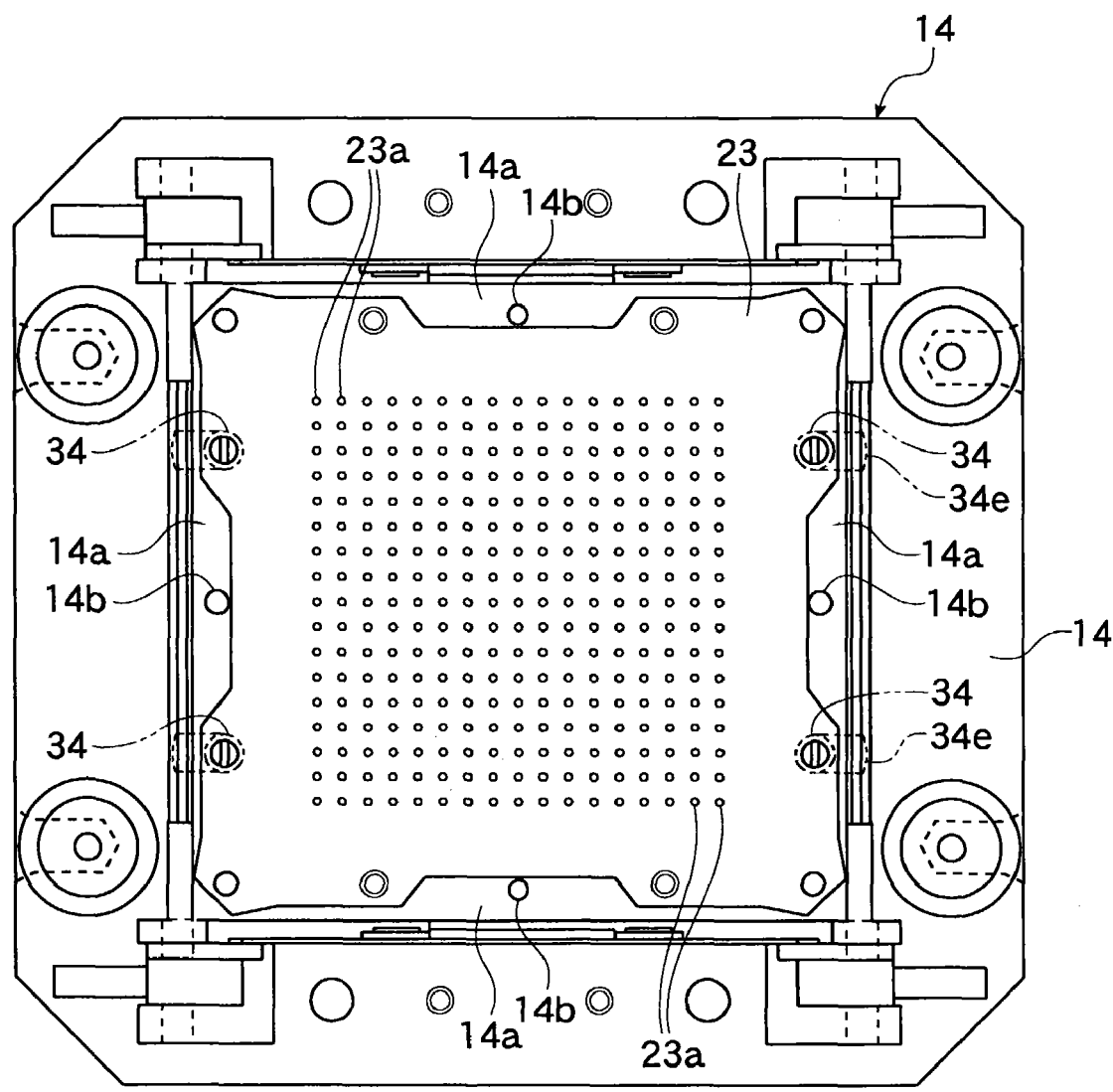
FIG. 5 is a bottom view of the IC socket of the first embodiment of FIG. 1.
Figure 6:
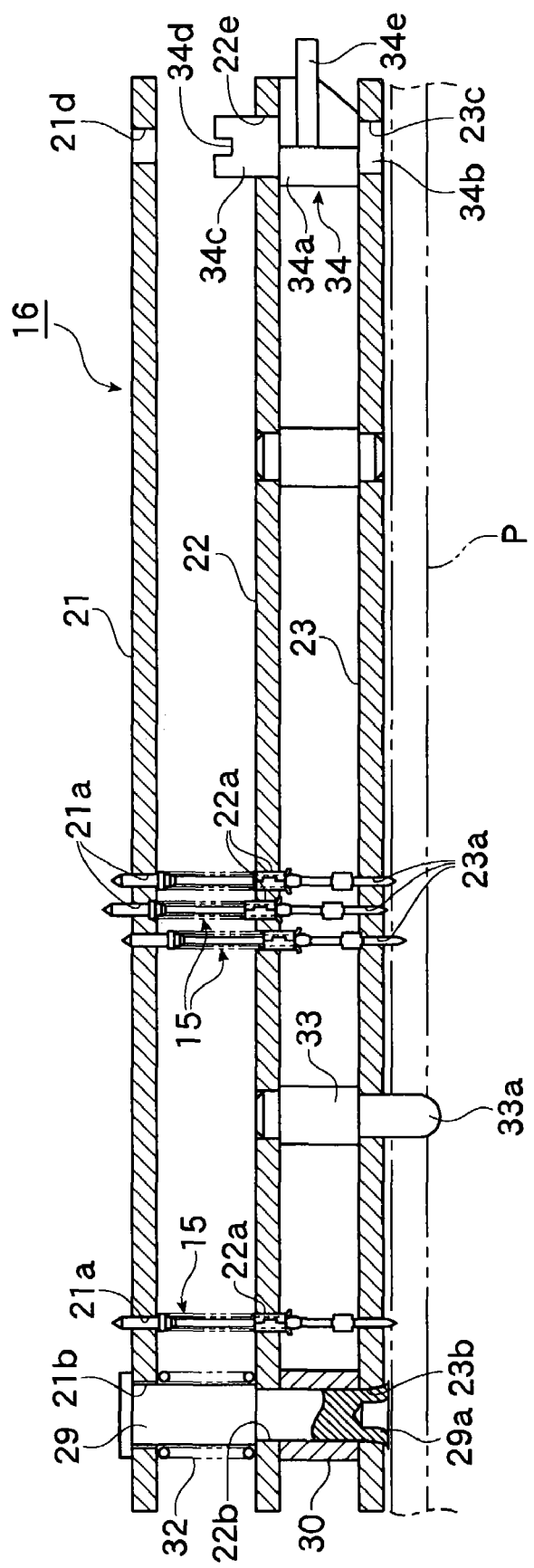
FIG. 6 is a sectional view showing a structure in which contact pins are assembled to the IC socket.

As shown in FIGS. 4 to 6, the contact pin assembly 16 is provided with a top plate 21, a middle plate 22 and a bottom plate 23, all made of synthetic resin having insulating property, by which the contact pins 15 are supported and held.

This contact pin 15 is composed of three members or sections, as shown in FIGS. 9 to 12, that is, a plunger 26, a bottom contact portion 27 and a spring 28.

The plunger 26 is formed from a metal material having an electric conductivity so as to provide a circular cut section and has a conical upper contact portion 26a formed to the upper end thereof, and a flanged portion 26b, acting as upper side coming-off prevention member, is formed to the lower side of the upper contact portion 26a.

The bottom contact portion 27 is formed from a plate member through press working so as to have, at its lower end, a lower contact portion 27a contacting the printed circuit board P, and a stopper portion 27b as lower-side coming-off preventing portion is formed to the upper side of the lower contact portion 27a. A tubular connection portion 27c into which the plunger 26 is inserted is further disposed above the stopper portion 27b and a pair of engaging tongue portions 27d, as engaging portions, are formed to the lower side of this connection portion 27c.

Figure 9A:
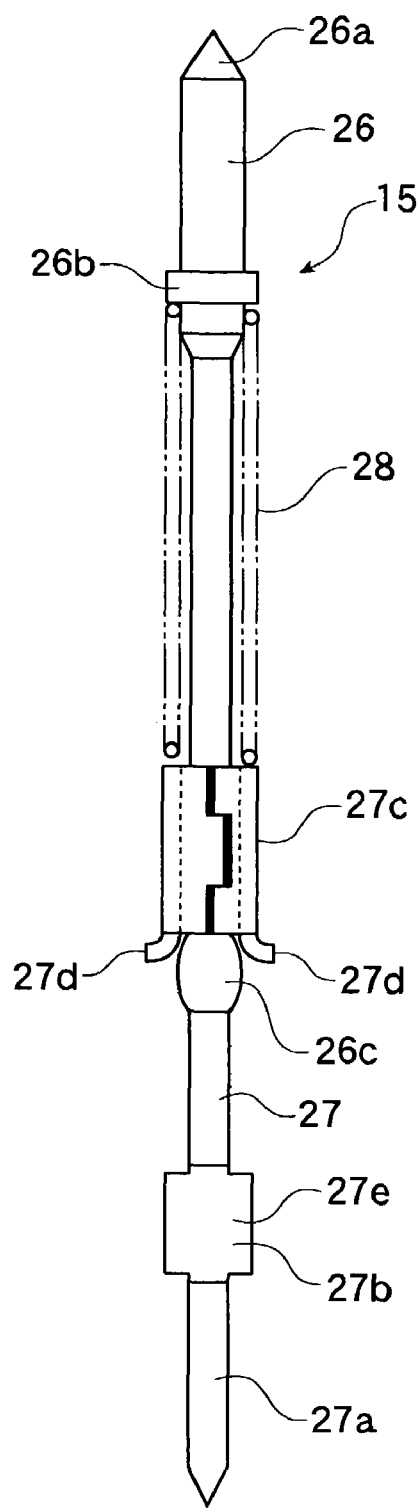
FIG. 9A is a front view thereof and FIG. 9B is a side view thereof.
Figure 9B:
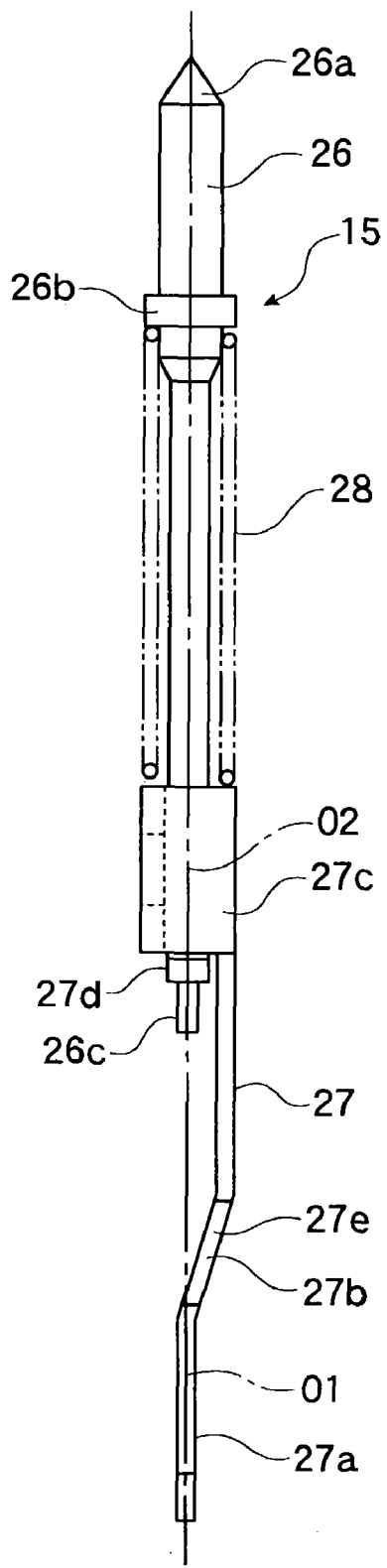
Figure 11C:
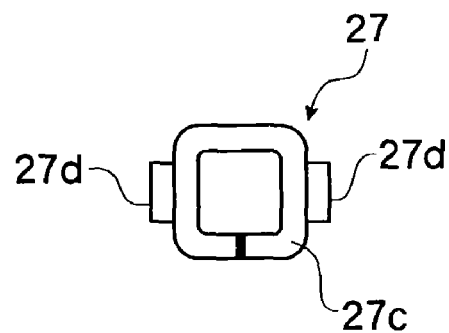
FIG. 11C is a plan view of FIG. 11A.
Figure 11A:
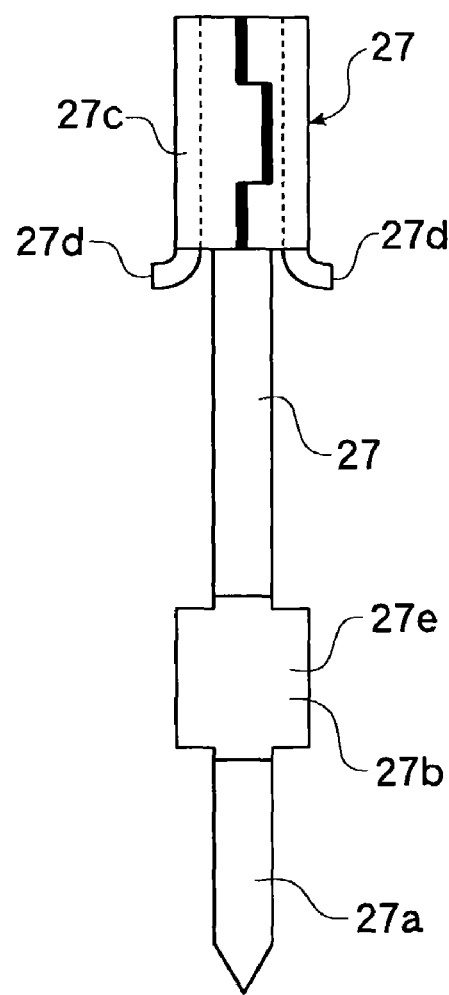
FIG. 11A is a front view thereof.
Figure 11B:
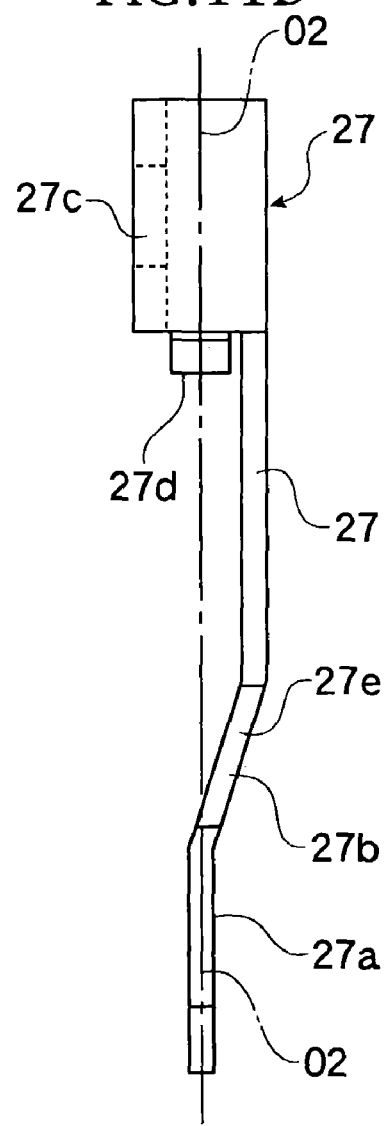
FIG. 11B is a right-side view of FIG. 11A
Figure 12A:
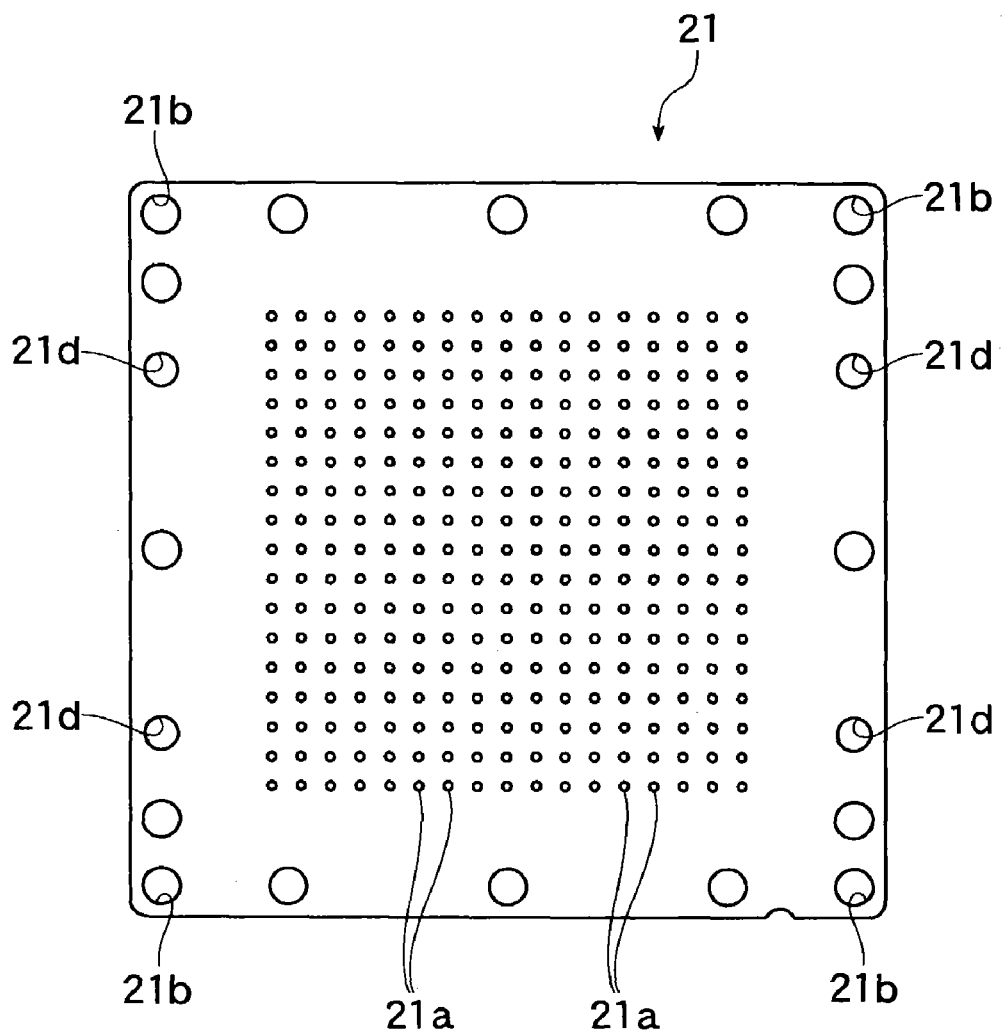
FIG. 12A is a plan view thereof and FIG. 12B is a front view thereof.
Figure 12B:
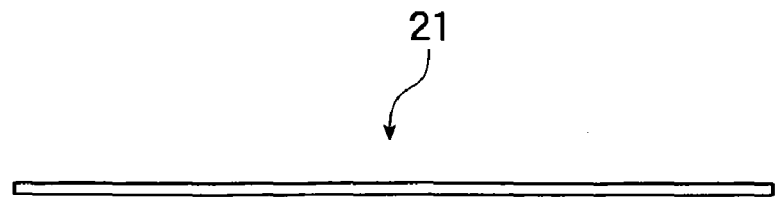
Figure 13A:
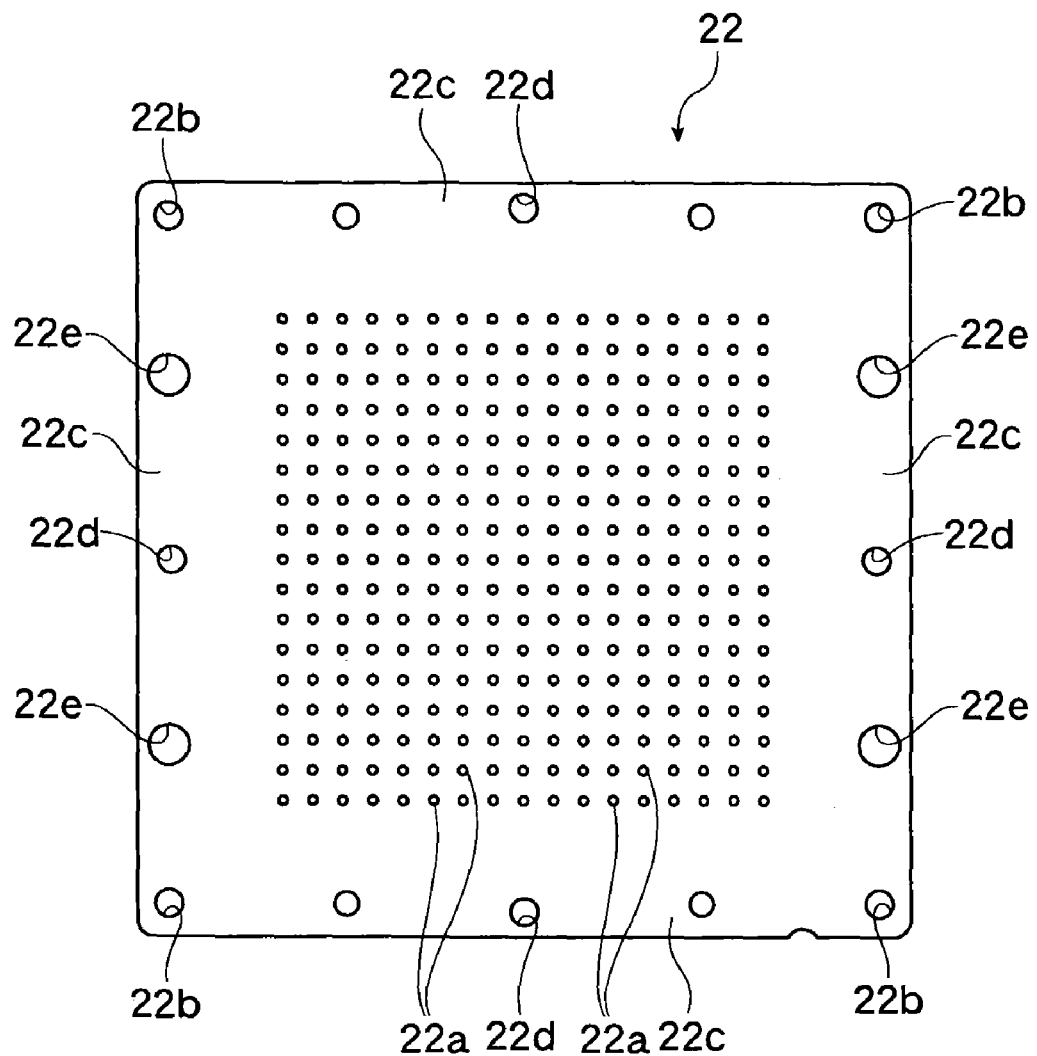
FIG. 13A is a plan view thereof and FIG. 13B is a front view thereof.
Figure 13B:
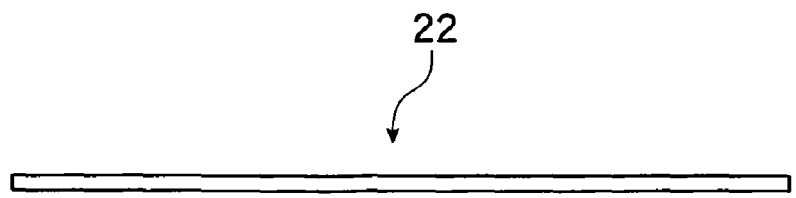
Figure 14A:
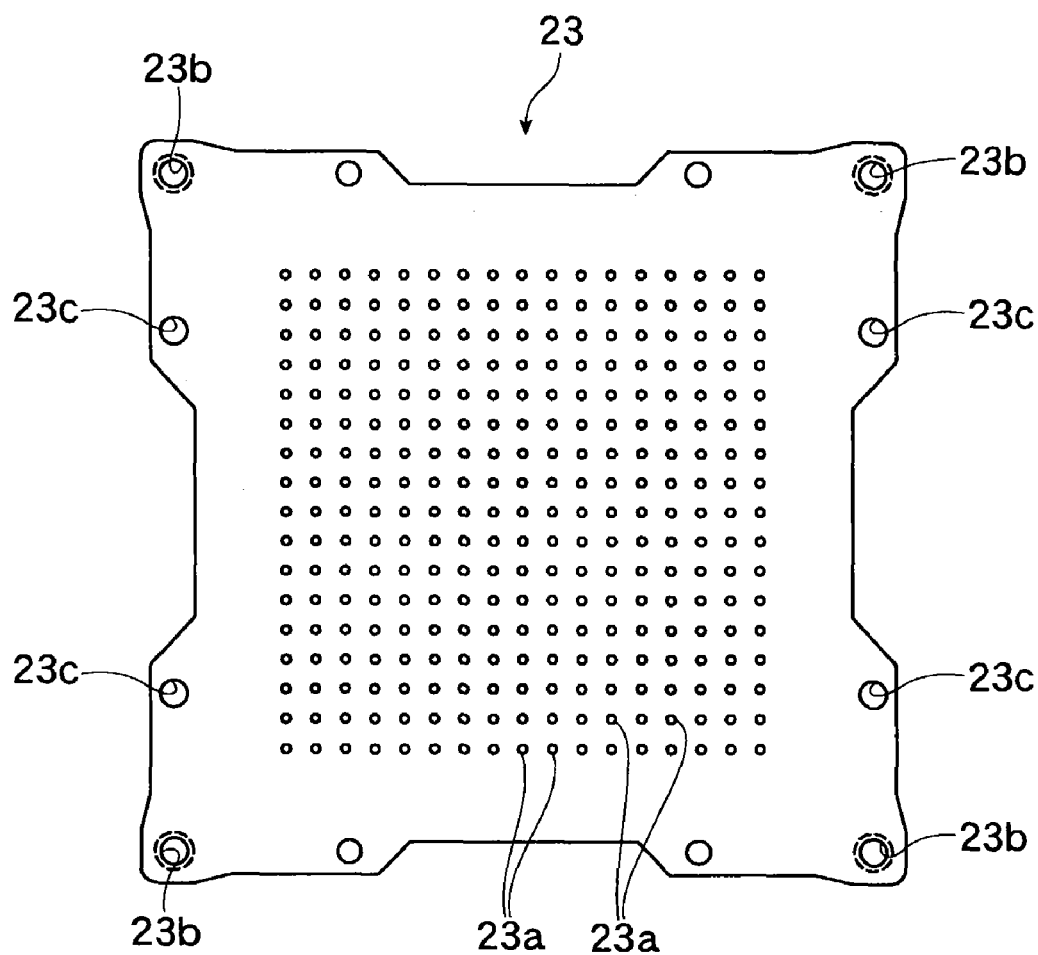
FIG. 14A is a plan view thereof and FIG. 14b is a front view thereof.
Figure 14B:
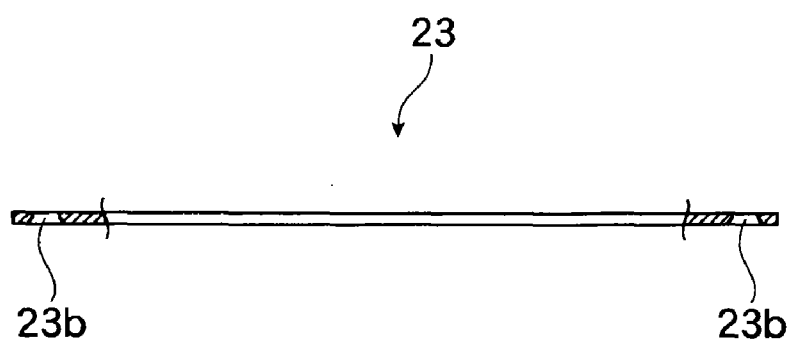

As shown in FIG. 9B, the bottom contact portion 27 of the structure mentioned above has a bent portion 27e at an intermediate portion thereof so that the center line O1 on the side of the lower contact portion 27a and the center line O2 of the plunger 26 accord with each other. That is, these center lines O1 and O2 are aligned with each other.

The plunger 26 is formed with a flat portion 26c as a coming-off preventing portion at a portion projecting downward from the connection portion 27c so as to provide a flat wide-width portion formed through press working to thereby prevent the plunger from coming-off the connection portion 27c of the bottom contact portion 27. That is, this flat portion 26c is formed by inserting a rod-shaped lower end portion of the plunger 26 into the connection portion 27c of the bottom contact portion 27 so that the front end projects thereover and then crushing the projected end portion by the press working. Otherwise, the flat-wide portion 26c may be first formed by crushing the rod-shaped end portion and then forcibly inserted into the connection portion 26c, or the plunger 26 formed with the flat-wide portion 26c may be positioned along the bottom contact portion 27 in an opened connection portion 27c, which is then closed.

The spring 28 is formed between the flanged portion 26b of the plunger 26 and the connection portion 27c of the bottom contact portion 27 so as to urge the plunger 26 and the bottom contact portion 27 in a direction apart from each other. The spring is first disposed in this position with a slightly compressed state so as to provide a preload.

A number of contact pins 15, each of the structure mentioned above, are disposed and arranged in the state held by the top plate 21, the middle plate 22 and the bottom plate 23. In more detail, the upper contact portion 26a of the plunger 26 is inserted into a through hole 21a formed to the top plate 21, and the flanged portion 26b abuts against the lower surface of the top plate 21 to thereby prevent it from coming off.

In addition, the middle plate 22 is formed with a through hole 22a so that the connection portion 27c of the bottom contact portion 27 can be inserted and guided to be vertically movable, and the upward moving of the bottom contact portion 27 is prevented by the abutment of the engaging tongue 27d against the lower surface of the middle plate 22. Furthermore, the bottom plate 23 has a through hole 23a into which the lower contact portion 27a of the bottom contact portion 27 is inserted so that the stopper portion 27b abuts against the upper surface of the bottom plate 23 to thereby prevent it from coming off in the downward direction.

These three plates 21, 22 and 23 are arranged with equal interval.

More specifically, with reference to FIG. 6, the respective plates 21, 22 and 23 are formed with mounting holes 21b, 22b and 23b in a straight alignment, into which a stepped rivet 29 are fitted and the lower end 29a (inserted end) of this rivet 29 is calked. A collar 30 is disposed between the bottom plate 23 and the middle plate 22 so as to maintain constant space therebetween, in which a spring 32 is disposed for urging upward the top plate 21 to vertically move the stepped rivet 29.

In addition, as also shown in FIG. 6, a positioning pin 33 is disposed between the bottom plate 23 and the middle plate 22. The positioning pin 33 is formed with a lower end 33a which is fitted to a positioning hole formed to the printed circuit board P so as to position the contact pin assembly 16 to a predetermined position of the printed circuit board P.

Furthermore, with reference to FIG. 4, the middle plate 22 is provided, at its peripheral portion, with four mount portions 22c, which are mounted on the support surface portion 14a of the base member 14, and to these mount portions 22c, there are formed idle insertion holes 22d for idly inserting positioning pins 14b projecting upward from the support surface portion 14a of the base member 14. Since these positioning pins 14b are idly inserted, the contact pin assembly 16 can be adjusted in its horizontal position with respect to the base member 14.

Figure 17:
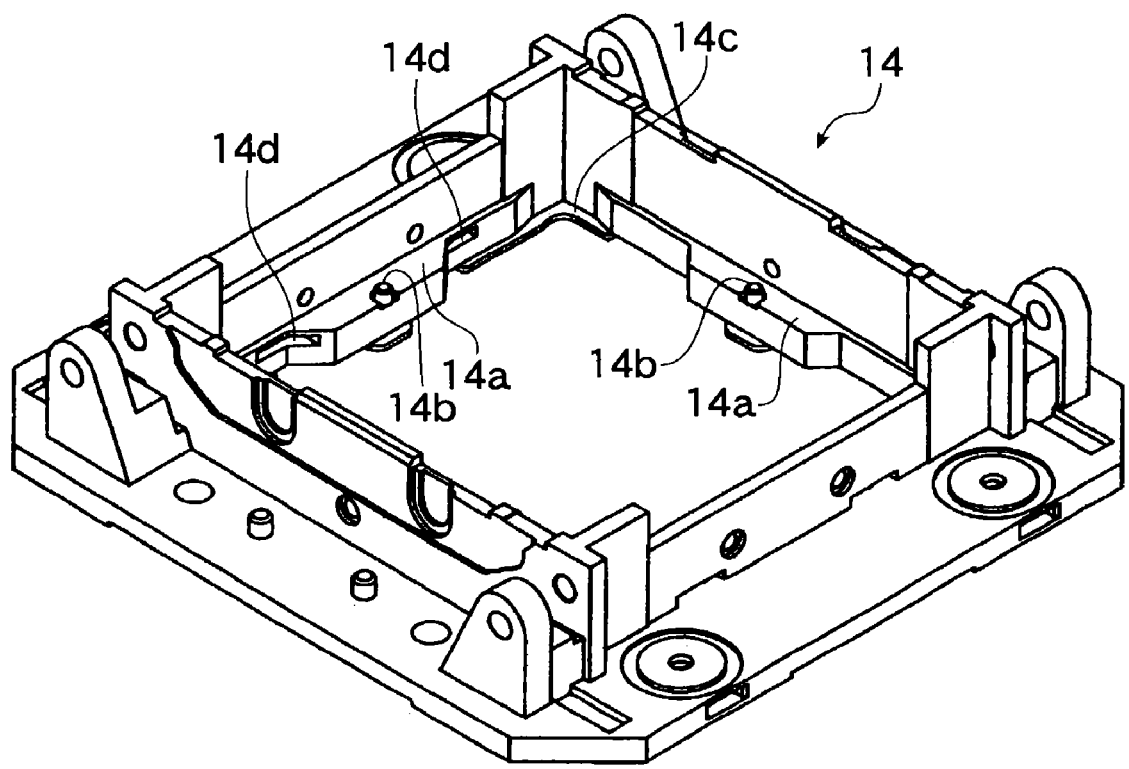
FIG. 17 is a perspective view of a base member of the socket body according to the first embodiment.
Figure 18:
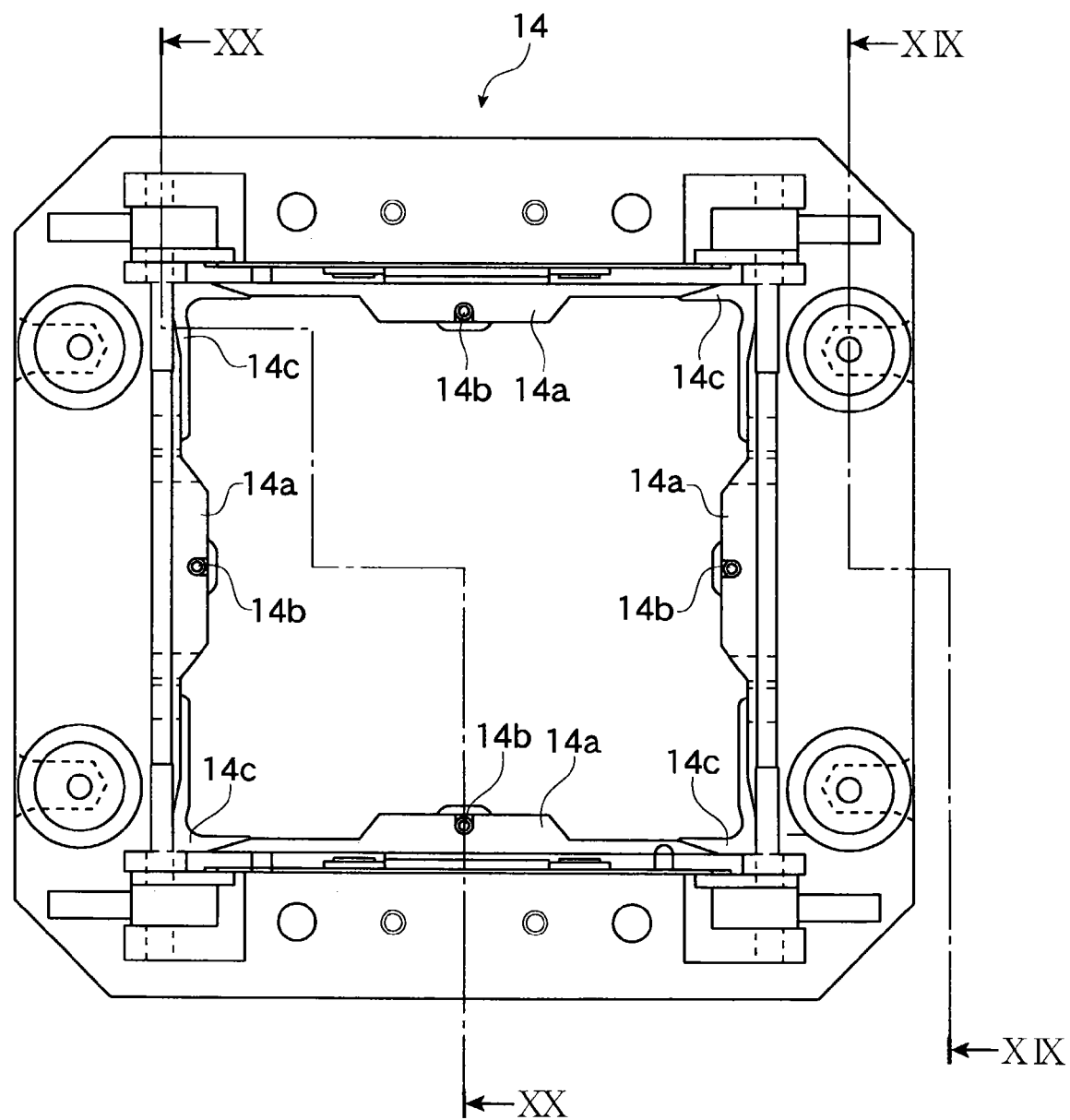
FIG. 18 is a plan view of the base member.

Still furthermore, the bottom plate 23 has a structure in which the peripheral portion thereof is mounted on a mount surface portion 14c of the base member 14 as shown in FIGS. 17 and 18.

Then, the upper contact portion 26a of the plunger 26 penetrates the through hole 21a of the top plate 21 so as to project slightly upward therefrom, and the lower contact portion 27a of the bottom contact portion 27 also penetrates the through hole 23a of the bottom plate 23 so as to project slightly downward therefrom.

The top plate 21 is provided with a guide member 21c of frame structure for guiding the IC package 12 when being accommodated.

The contact pin assembly 16 of the structure mentioned above is inserted from the upper side and accommodated into the frame-shaped base member 14 and is thereafter held to the base member 14 by lock members 34 disposed at four portions.

Figure 15:
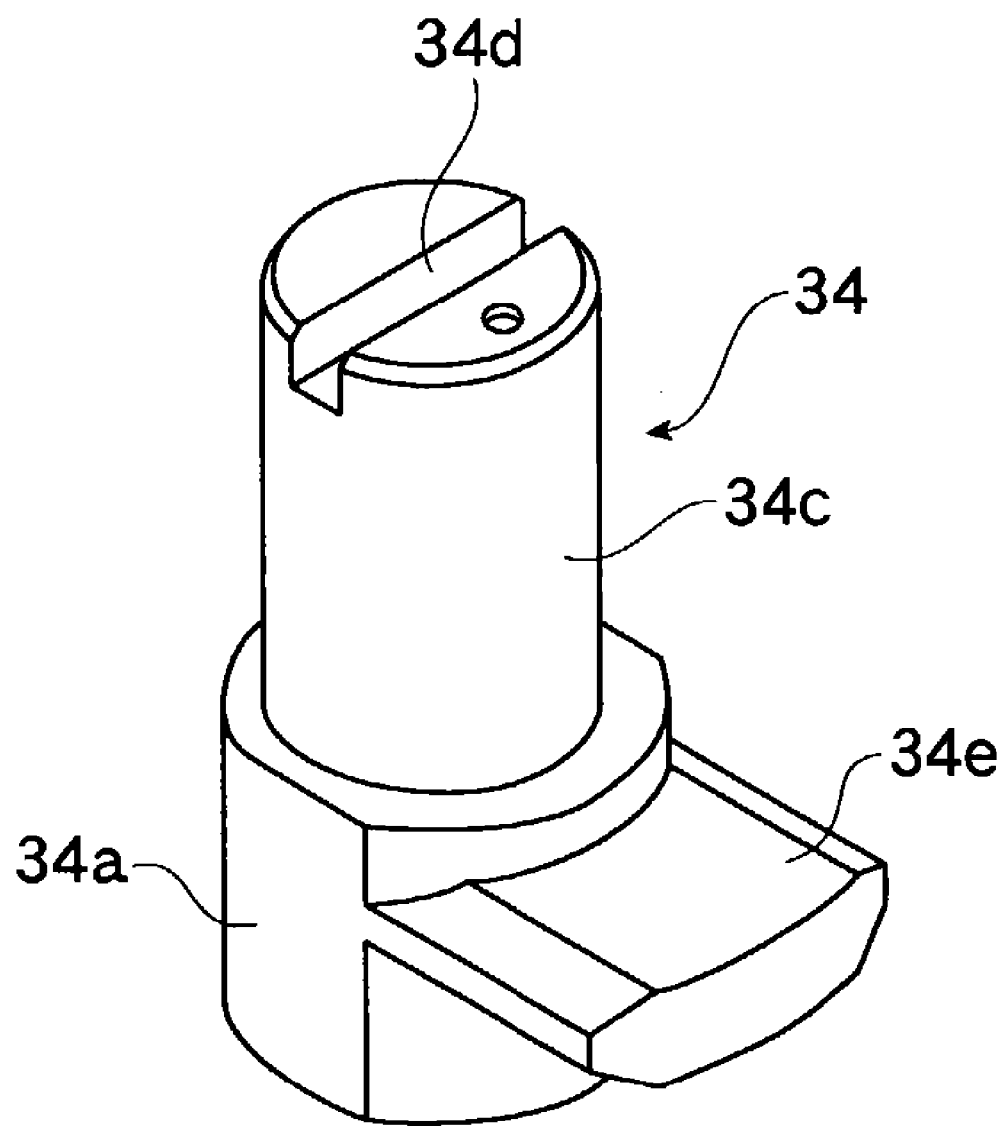
FIG. 15 is a perspective view of a lock member for mounting the contact pin assembly according to the first embodiment.
Figure 16C:
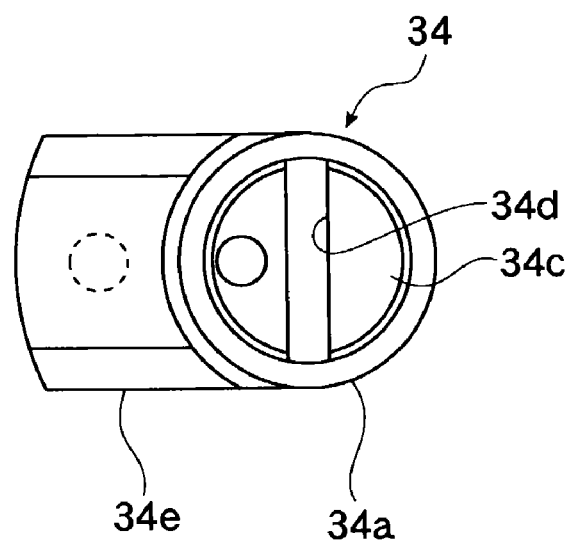
FIG. 16C is a plan view of FIG. 16A.
Figure 16B:
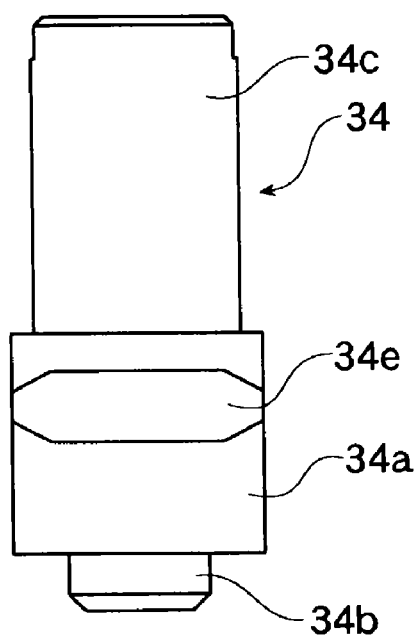
FIG. 16B is a left-side view of FIG. 16A
Figure 16A:
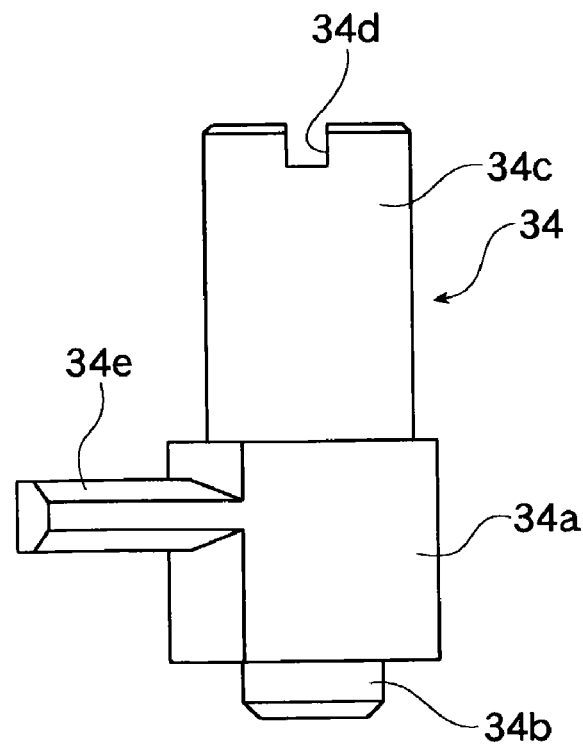
FIG. 16A is a front view thereof.

More in detail, as shown in FIGS. 6, 15 and 16, the lock member 34 is composed of a large diameter portion 34a, and lower and upper small diameter portions 34b and 34c which are formed at lower and upper portions of the large diameter portion 34a. The lower small diameter portion 34b is fitted to a fitting hole 23c of the bottom plate 23 to be rotatable and, on the other hand, the upper small diameter portion 34c is fitted to a fitting hole 22e of the middle plate 22 to be rotatable. Thus, the lock member 34 is disposed to be rotatable such that the large diameter portion 34a is snapped between the middle plate 22 and the bottom plate 23.

The upper small diameter portion 34c projects upward by a predetermined amount from the middle plate 22 and is formed, at its upper surface, with an operation groove 34d adapted to be rotated by a tool, which is inserted through an operation hole 21d formed to the top plate 21, as shown in FIG. 6, and fitted to the groove 34d to be driven.

The operation hole 21d has a diameter smaller than the diameter of the upper small diameter portion 34c of the lock member 34. When the top plate 21 is lowered, the lower surface of the top plate 21 abuts against the upper surface of the lock member 34 so as to act a stopper member for stopping the lowering motion of the top plate 21.

Figure 19:
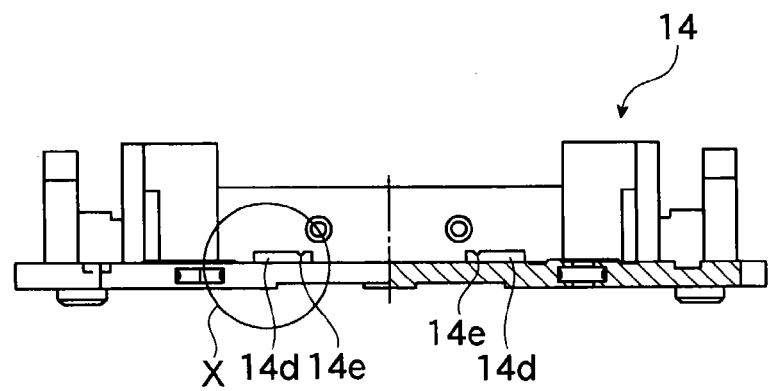
FIG. 19 is a sectional view taken along the line XIX—XIX in FIG. 18.
Figure 20:
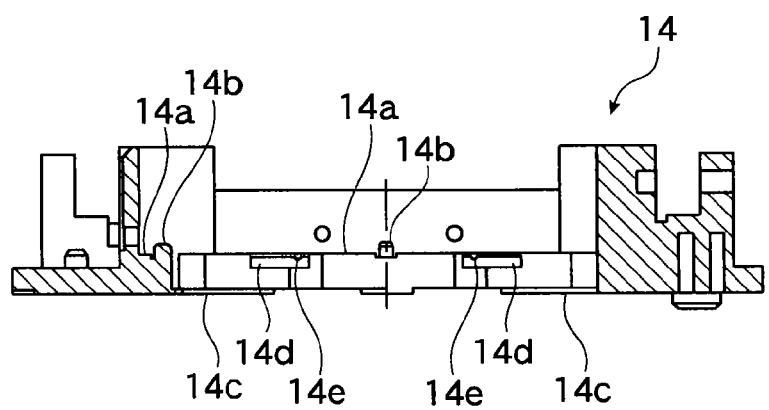
FIG. 20 is a sectional view taken along the line XX—XX in FIG. 18.
Figure 21:
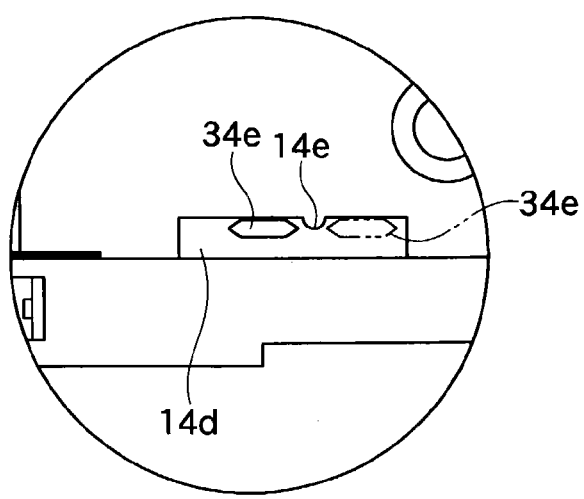
FIG. 21 is an enlarged view of a portion X in FIG. 19.

Moreover, the lock member 34 is provided with an engaging projection 34e projecting substantially horizontally as shown in FIG. 15, and this projection 34e is detachably inserted into a slit 14d of the base member 14 as shown in FIGS. 19 to 21. A lock projection 14e is formed to a ceiling, i.e., upper wall section, of the slit 14d so as to protrude downward. Further, the engaging projection 34e is formed to the lock member 34 so that the upper surface of the projection 34e has substantially the same level as the ceiling wall section 14d of the slit 14d when engaged.

When the lock member 34 is rotated and the engaging projection 34e is then inserted into the slit 14d of the base member 14, and the inserted projection 34e is moved so as to get over the lock projection 14e from the position shown with the solid line to the position shown with a two-dot chain line as shown in FIG. 21. According to this motion, the rotation of the lock member 34 is limited and the engaged state between the engaging projection 34e and the slit 14d is maintained, thus limiting the upward movement of the engaging projection 34e of the lock member 34.

On the other hand, with reference to FIGS. 1 to 4, a lateral pair of open/close members 17, which press, from the upper side, the IC package 12 accommodated on the contact pin assembly 16, are mounted to the base member 14 to be pivotal in both directions respectively.

Each of the open/close members 17 has a base plate 35 to which a press member 36 pressing the IC package 12 is mounted, and these members are connected to the base member 14 and the operation member 18 through the link mechanism 37 so that the open/close members 17 are opened or closed in accordance with the vertical movement of the operation member 18.

Each of the link mechanisms 37 is composed of a first link member and a second link member 40, and the first link member includes an first link out side member 38 and an first link inside member 39.

The first link outside member 38 and first link inside member 39 are supported, at their one end portions, to the base member 14 to be vertically rotatable (pivotal) through a support shaft 41. These first link outside and inside members 38 and 39 are arranged in a symmetric manner on both sides of the base plate 35. Furthermore, these first link outside and inside members 38 and 39 are mounted, at portions near their other end portions, to the base plate 35 to be rotatable through a mount shaft 42.

The second link member 40 is provided, as shown in FIG. 1, with a pair of side plates 40a disposed on both sides of the press member 36 and a plate-shaped connection bridge piece 40b connecting these side plates 40a. These side plates 40a are snapped respectively between the first link outside member 38 and the first link inside member 39 to thereby maintain a parallel arrangement of these first link outside and inside members 38 and 39 with a predetermined distance.

Each of the side plate 40a of the second link member 40 is mounted, at its one end portion, to the operation member 18 to be rotatable through a force-point shaft 45, and the other end portion of the side plate 40a and the other end portions of the first link outside and inside members 38 and 39 are coupled together to be rotatable through a coupling shaft 46.

According to the structure and arrangement mentioned above, when the operation member 18 is lowered from the uppermost position shown in FIG. 3 to the lowermost position shown in FIG. 4, the position of the force point shaft 45 descends and the lower edge portion of the side plate 40a of the second link member 40 abuts against the support shaft 41. At this moment, the coupling shaft 46, as an operation point, is pivoted upward with the support shaft 41 being fulcrum, whereby the first link outside and inside members 38 and 39 are pivoted upward about the support shaft 41 through the mount shaft 42 and the open/close member 17 is then opened upward to its standing position. The above operation is performed with respect to the paired open/close members 17. Under the standing position of the open/close members 17, the IC package 12 can be accommodated or taken out.

Moreover, the operation member 18 has a rectangular frame shape, and as shown in FIG. 3, is attached to the base member 14 by means of stepped bolt (shoulder bolt) 43 to be vertically movable and urged upward by means of spring 44.

The assembling or mounting steps of the contact pin assembly 16 will be described hereunder.

In the first step, the top plate 21 and the middle plate 22 are assembled together, which is then set in an inverted (upside down) fashion. That is, the top plate 21 and the middle plate 22 are assembled by inserting the stepped rivets 29 into the mount holes 21b and 22b formed to these plates 21 and 22 and the spring 28 is disposed between these plates 21 and 22. Such assembled structure is inverted and then set in a fashion that the middle plate 22 is positioned above the top plate 21. It is of course possible to initially set the middle plate 22 upper-side and the top plate 21 lower-side.

Then, each of the contact pins 15 is inserted, also in an inverted fashion, into the through hole 22a of the middle plate 22 and then into the through hole 21a of the top plate 21 from the side of the upper contact portion 26a of the plunger 26. In this setting, since the diameter of the flange portion 26b of the plunger 26 is formed to be substantially the same as the diameter of the connection portion 27c of the bottom contact portion 27, the flange portion 26b of the plunger 26 can pass the through hole 22a of the middle plate 22.

In the next step, under the state mentioned above, the bottom plate 23 is arranged above the middle plate 22, and the lower contact portion 27a of the bottom contact portion 27 is inserted into the through hole 23a of the bottom plate 23. This arrangement of the bottom plate 23 is performed by inserting the stepped rivet 29 into the collar 30 and then inserting the stepped rivet 29 into the mount hole 23b of the bottom plate 23. Further, the positioning pin 33 and the lock member 34 are disposed in a snapped state between the middle plate 22 and the bottom plate 23.

Thereafter, the stepped rivet 29 is calked, the top plate 21, the middle plate 22 and the bottom plate 23 are assembled at predetermined distance, which act to support and hold a number of contact pins 15 in the state shown in FIG. 4, for instance, thus completing the assembling of the contact pin assembly 16.

Such contact pin assembly 16 is assembled to the base member 14 in the following manner.

The contact pin assembly 16 is first inserted inside the frame-shaped base member 14 from the upper side thereof in a manner such that the mount portion 22c of the middle plate 22 is placed on the support surface 14a of the base member 14, and the positioning pin 14b of the base member 14 is then inserted into the idle insertion hole 22d formed to the mount portion 22c. In this step, the peripheral edge portion of the bottom plate 23 is placed on the mount surface portion 14c of the base member 14.

Thereafter, a tool is inserted into the operation groove 34d of the lock member 34 through the operation hole 21d formed to the top plate 21. The tool is then rotated to move the engaging projection piece 34e of the lock member 34 into the slit 14d of the base member 14 as shown with the solid line in FIG. 21. In such inserted state of the projection piece 34e, as the lock member 34 is further rotated, the engaging projection piece 34e is slightly elastically deformed downward and moves over the lock projection piece 14e and then stops there in the position as shown with two-dot chain line in FIG. 2. Accordingly, in a state that no specific external force is applied to the lock member 34, the lock member 34 never rotate and the locking state can be kept even if the IC socket be carried or slightly moved.

When the contact pin assembly 16 is assembled and mounted to the base member 14, the base member 14 may be preliminarily mounted to the printed circuit board P or not.

On the other hand, when it is required to disassemble or remove the contact pin assembly 16 from the base member 14, the lock member 34 is rotated in a direction reverse to the direction at the time of assembling so that the engaging projection piece 34e is moved to get over the lock projection piece 14e of the base member 14 and remove from the slit 14d. When the contact pin assembly 16 is then lifted upward, it can be easily removed from the base member 14.

According to the manner mentioned above, the contact pin assembly 16 can be easily changed with another contact pin assembly even if it has a different contact pin arrangement, and in addition, by dismounting the contact pin assembly 16 from the base member 14, the contact pins 15 of optional structures can be easily changed.

Furthermore, since the contact pin assembly 16 inserted into the base member 14 from the upper side thereof and can be easily assembled, the contact pin assembly 16 can be easily mounted and exchanged even in a case that the base member 14 was preliminarily mounted to the printed circuit board P.

Still furthermore, since the lock member 34 can be handled and operated from the upper side, the contact pin assembly 16 can be easily assembled to or dismounted from the base member 14 even in the arrangement that another IC socket 11 is arranged near on the printed circuit board P.

Incidentally, in a case where the contact pin assembly 16 is mounted to the base member 14 by inserting the shaft from the horizontal direction of the base member 14, it is necessary to locate a space, for mounting or dismounting the shaft, beside the IC socket 11, and in a case where a plurality of IC sockets 11 are arranged side-by-side in a narrow space, it may be difficult to mount the contact pin assembly 16 to the base member 14 in the state that the base member 14 is preliminarily mounted to the printed circuit board P.

In addition, in the mounting of the contact pin assembly 16 to the base member 14, the positioning pin 14b of the base member 14 is idly inserted into the insertion hole 22d of the middle plate 22 so that the base member 14 is adjustable in the horizontal direction with respect to the contact pin assembly 16 to be relatively movable. Accordingly, the contact pin assembly 16 is arranged to the predetermined position on the printed circuit board P, and on the other hand, for the base member 14, even if the base member 14 is shifted in its mounting position to the printed circuit board P, the shifting can be compensated.

In other words, it is necessary to mount the contact pin assembly 16 to the printed circuit board P with the predetermined positional relationship in order to contact the contact pin 15 to the electrode P1. On the other hand, however, it is difficult to mount, at high performance, both the contact pin assembly 16 and the base member 14 at the predetermined positions with respect to the printed circuit board P. Therefore, even in the case that the positional relationship between the contact pin assembly 16 and the base member 14 are shifted from each other, by adopting the structure capable of allowing such positional shifting, the contact pin assembly 16 can be mounted to the predetermined position of the printed circuit board P.

According to the structure of the described embodiment, since the middle plate 22 arranged at an intermediate position in the vertical arrangement of the contact pin assembly 16 is mounted and supported to the support surface portion 14a of the base member 14, the mounting performance in the vertical direction of the contact pin assembly 16 with respect to the base member 14 can be improved and, moreover, the distance between the upper surface of the top plate 21 of the contact pin assembly 16 and the lower surface of the base member 14 can be set to a predetermined value. That is, height level of the upper surface of the top plate 21 from the printed circuit board P can be set to a predetermined height level.

For example, in a case that the contact pin assembly 16 is supported on the base member 14 with the bottom plate 23 disposed most downward being a reference, the scattering in the mounting performance of the contact pin assembly 16 in the vertical direction gives influence on the scattering of the distance between the upper surface of the top plate 21 and the lower surface of the base member 14.

On the contrary, in the present invention, the middle plate 22 disposed at the intermediate position in the vertical direction is mounted and supported onto the support surface 14a of the base member 14. According to this arrangement, only the scattering between the top plate 21 and the middle plate 22, not the scattering in the entire structure of the contact pin assembly 16, gives adverse influence on the distance between the upper surface of the top plate 21 of the contact pin assembly 16 and the lower surface of the base member 14, so that the scattering can be made small.

Thus, the pushed amount of the IC package 12 can be made constant, thus also making constant the contacting pressure.

Further, the scattering in the distance between the upper surface of the top late 21 of the contact pin assembly 16 and the lower surface of the base member 14 will result in the changing in the pushing amount of the open/close member 17 of the IC package 12, so that it is difficult to make constant the contacting pressure between the contact pin 15 and the IC package 12 and between the IC package and the printed circuit board P.

Moreover, in the arrangement of the described embodiment, any force applied by the contact pins 15 do not influence the respective plates 21, 22 and 23 of the contact pin assembly 16. Therefore, even if these plates 21, 22 and 23 have relatively thin thickness, they will be free from deformation, and hence, the weight thereof can be reduced and the manufacturing cost can be also reduced.

The IC socket 11 according to the present invention will operate as follows.

Figure 7:
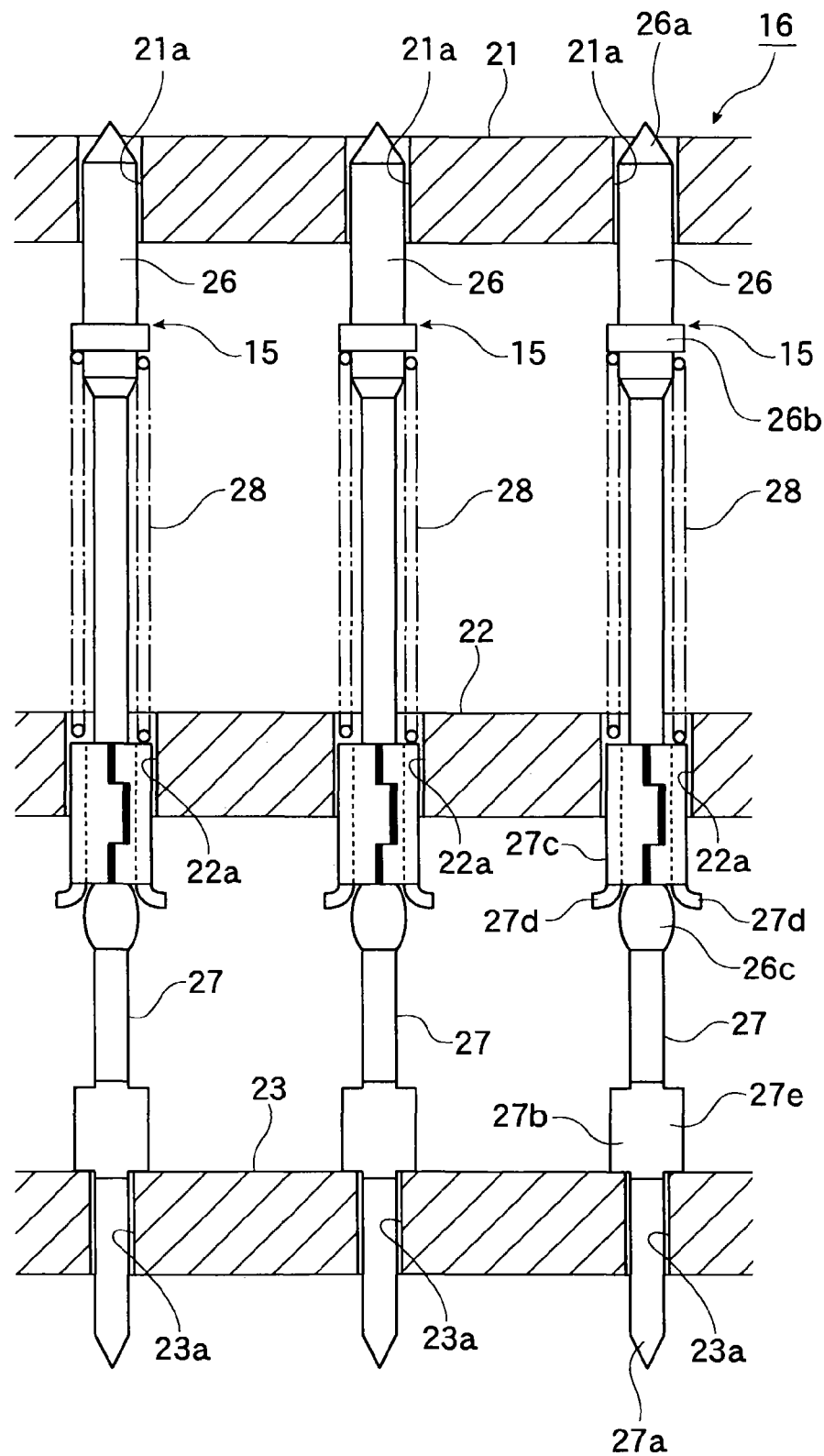
FIG. 7 is a sectional view showing, in an enlarged scale, of an arrangement of the contact pins before the IC socket is mounted to a printed circuit board.
Figure 8:
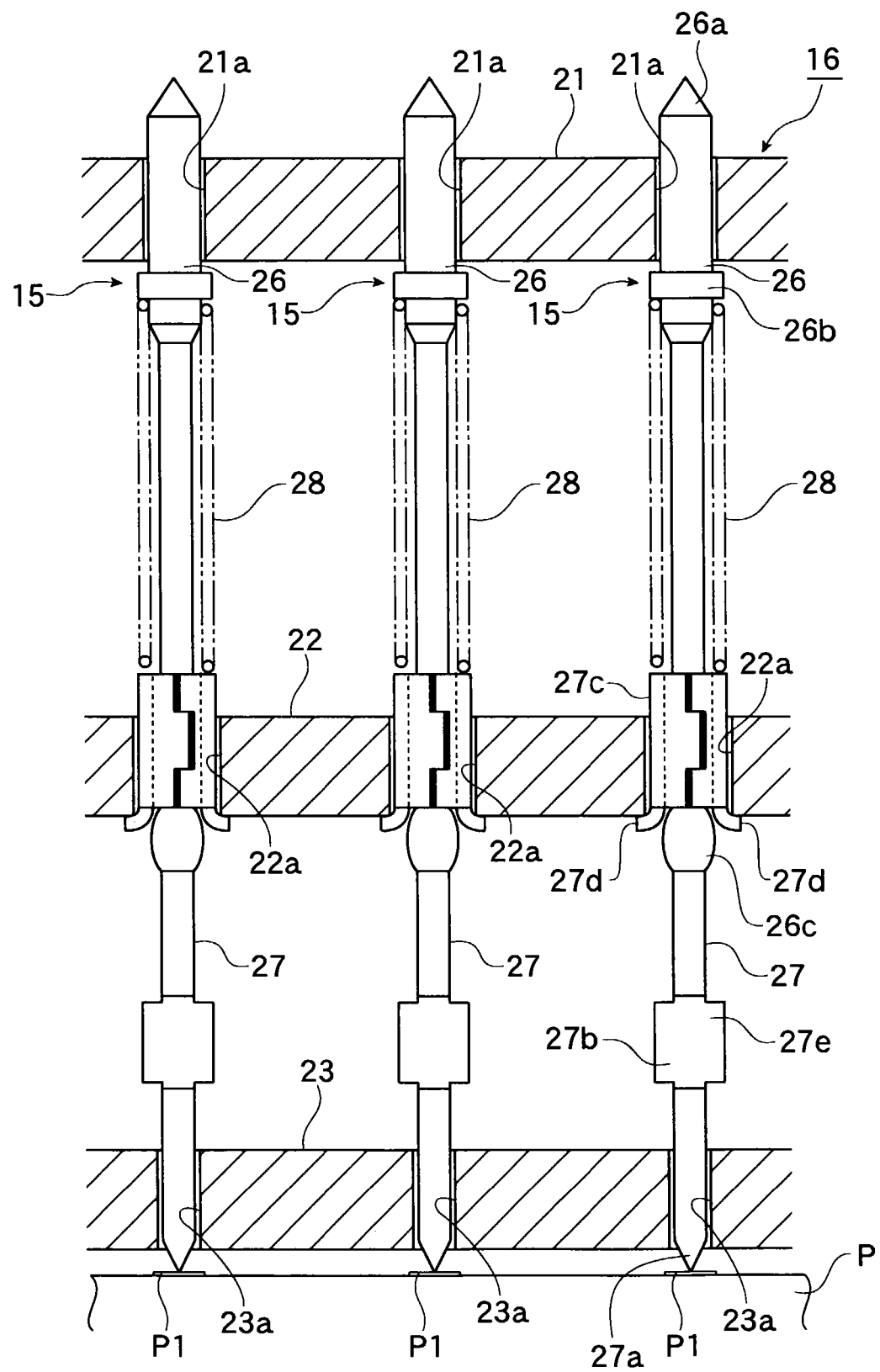
FIG. 8 is a sectional view showing, in an enlarged scale, of an arrangement of the contact pins after the IC socket is mounted to a printed circuit board.

In a state before the IC socket 11 is mounted to the printed circuit board P, as shown in FIG. 7, the contact pins 15 take their lowering positions because of self weight. In the shown state, when the IC socket 11 is mounted to the printed circuit board P, lower contact portion 27a of the bottom contact portion 27 abuts against the electrode P1 of the printed circuit board P, each of the contact pin 15 is pushed up and the engaging tongue 27d of the bottom contact portion 27 engages with the lower surface of the middle plate 22 as shown in the state of FIG. 8.

According to this engagement, the upward movement of the contact pin 15 is restricted and the contacting condition between the electrode P1 of the printed circuit board P and the lower contact portion 27a of the bottom contact portion 27 can be maintained. This contacting state can be maintained even if a long term has passed with the state that the IC socket 11 is arranged on the printed circuit board P, so that any dust or dirt does not intrude into a gap between the lower contact portion 27a and the electrode P1, thus always maintaining a good conductivity thereof.

Furthermore, in the state that the upward movement of the contact pin 15 is limited, the flanged portion 26b of the plunger 26 does not abut against the top plate 21, to which any external force is hence not applied.;

Accordingly, the top plate 21 having thin thickness can be employed and, hence, the IC socket can be made compact in size. Furthermore, the entire weight thereof can be reduced and the manufacturing cost can be also reduced.

Figure 22:
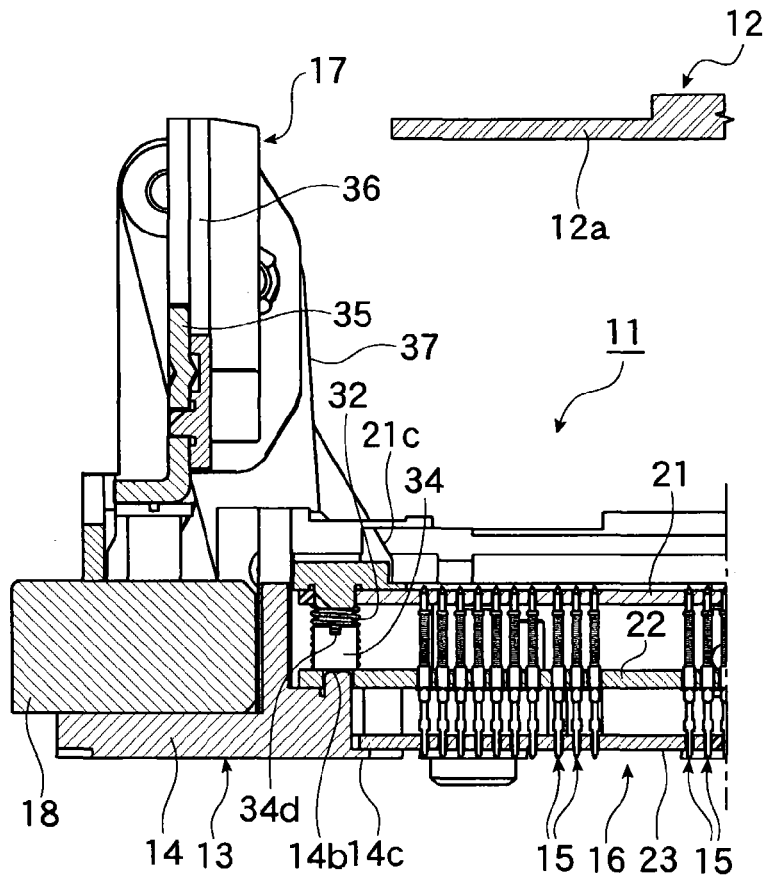
FIG. 22 is a sectional view of the open/close member according to the first embodiment showing the opened state thereof.
Figure 23:
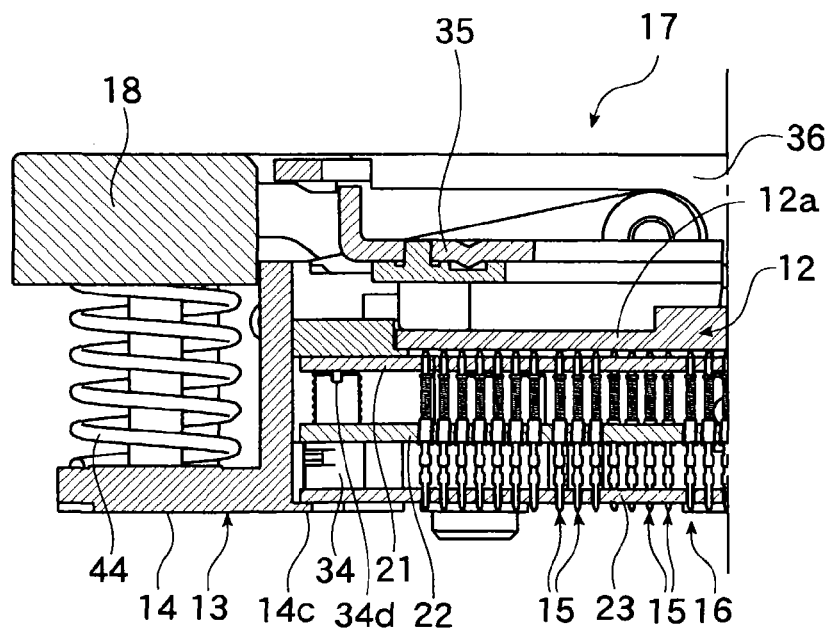
FIG. 23 is a sectional view of the open/close member according to the first embodiment showing the closed state with the IC package being accommodated.

In order to accommodate the IC package 12 to the IC socket 11 from the state mentioned above, the operation member 18 is lowered against the urging force of the spring 44. Then, the open/close members 17 are rotated in their opening directions by means of link mechanisms 37, and as shown in FIG. 22, the open/close members 17 take their standing (rising) positions.

From this state, the IC package 12 is accommodated on the top plate 21 of the contact pin assembly 16. In this operation, the IC package 12 is guided by the guide members 21c of the top plate 21 and accommodated in its predetermined position.

Next, when the pressing force on the operation ember 18 is released, the operation member 18 is moved upward by the urging force of the spring 44 and the open/close member 17 is rotated in its closing direction through the link mechanism 37 to thereby take its horizontal position.

According to the operations mentioned above, the IC package 12 is pressed downward by the open/close member 17, the top plate 21 is lowered by the urging force of the spring 32, and the upper contact portion 26a of the plunger 26 contacts the plate-shaped terminal 12b of the IC package 12 at a predetermined pressure.

That is, the contact pin 15 is pressed by the plate-shaped terminal 12b of the IC package 12 to thereby compress the spring 28 by a predetermined displacement, and according to the urging force of this string 28, the upper contact portion 26a of the plunger 26 contacts the plate-shaped terminal 12b of the IC package 12 at the predetermined contacting pressure.

Further, the lower contact portion 27 of the bottom contact portion 27 also contacts the printed circuit board P at a predetermined contacting pressure.

Thus, in such contact pin 15, the plunger 26 and the bottom contact portion 27 are electrically connected through the slidably contacting portion between the plunger 26 and the connection portion 27c of the bottom contact portion 27 and via the spring 28.

Furthermore, in such arrangement as mentioned above, the spring 28 is preloaded, and in comparison with a spring which is not preloaded, the spring force with respect to vertical stroke of the plunger 26 can be made small. Accordingly, in the case where the pressing amount (i.e., lowering amount) of the plunger 26 is changed, the spring force can be made smaller, so that a substantially constant contacting pressure is obtainable.

The IC package 12 and the printed circuit board P are thus electrically connected through the contact pin 15 and a burn-in test of the IC package 12 can be performed.

Moreover, such contact pin 15 is composed of merely three parts, the plunger 26, the bottom contact portion 27 and the spring 28, so that parts or elements for the composition of the contact pin can be eliminated.

Furthermore, since the bottom contact portion 27 is formed through a press working and the rod-shaped plunger 26 is slidably inserted into the connection portion 27c of the bottom contact portion 27, it is not necessary to form a tubular section as in the prior art structure, so that the contact pin 15 can be easily formed with reduced cost, thus being advantageous.

In addition, the bottom contact portion 27 has the bent section 27e, and as shown in FIG. 9B, is formed such that the center line O1 of the lower contact portion 27a aligns on the same line with the center line O2 of the plunger 26. Accordingly, the respective through holes 21a, 22a and 23a of the top, middle and bottom plates 21, 22 and 23 are formed so as to lie on the same straight line, whereby the assembling working of these plates 21, 22 and 23 and the arrangement of the contact pins 15 can be effectively achieved. Moreover, reaction forces from the IC package 12 and the printed circuit board P act on the same center line (O1, O2), so that the plunger 26 and the bottom contact portion 27 can be relatively smoothly moved.

Still furthermore, the plunger 26 is provided with the flanged portion 26b abutting against the lower surface of the top plate 21 to thereby restrict the upward movement of the plunger 26, and on the other hand, the bottom contact portion 27 is provided with the stopper portion 27b abutting against the upper surface of the bottom plate 23 to thereby restrict the downward movement of the bottom contact portion 27. Therefore, the contact pin 15 can be easily held between the top plate 21 and the bottom plate 23. Further, by removing the bottom plate 23, the contact pin 15 can be easily mounted or exchanged.

In addition, the structure of the described embodiment allows the connection portion 27c of the bottom contact portion 27 to be vertically movable through the middle plate 22, so that the connection portion 27c of the bottom contact portion 27 can be held to be vertically movable to thereby prevent the contact pin 15 from being bent at its middle portion.

[Second Embodiment 2]

Figure 25:
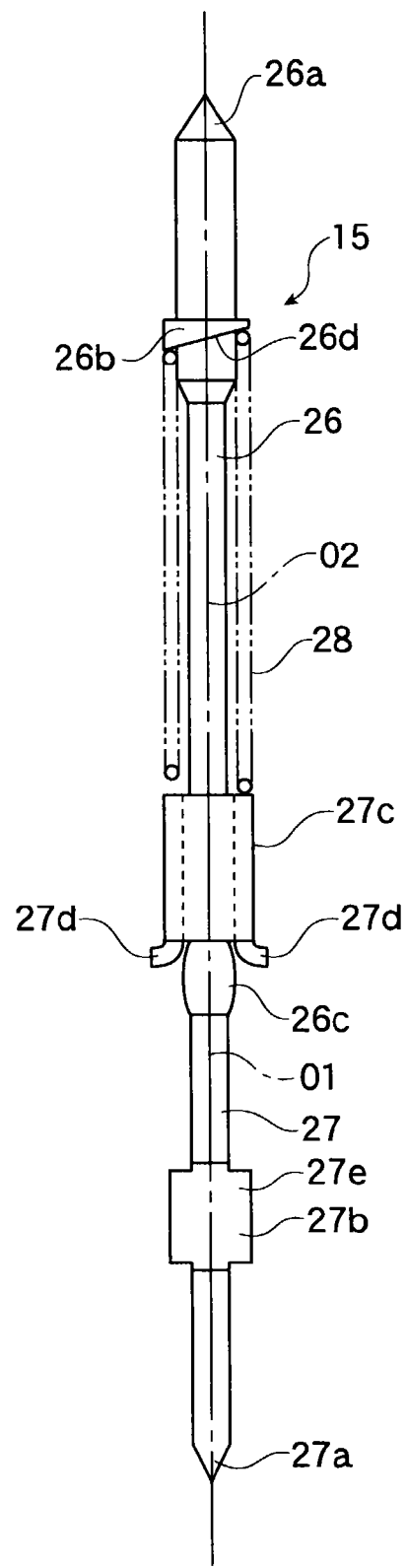
FIG. 25 is a front view showing a contact pin according to a second embodiment of the present invention.

The second embodiment of the present invention will be described hereunder with reference to FIG. 25.

In this second embodiment of the contact pin 15, the flange portion 26b of the plunger 26 has an inclined surface 26d (lower surface as viewed), and the spring 28 is disposed between the inclined surface 26d and the upper end surface of the connection portion 27c of the bottom contact portion 27.

According to this structure, when the plunger 26 is depressed by the IC package 12 and the spring 28 is then compressed, the compression force along the center line O2 of the plunger 26 generates a force inclined with respect to the center line O1 of the bottom contact portion 27. Therefore, when the plunger 26 is pressed downward, the connection portion 27c of the bottom contact portion 27 and the plunger 26 inserted into this connection portion 27 always slidably contact each other, thus maintaining the stable conducting state therebetween.

In this embodiment, although the flanged portion 26b of the plunger 26 is formed with the inclined surface 26d, the upper surface of the connection portion 27c may be instead inclined or it may be possible to incline both the flanged portion 26b and the connection portion 27c.

Figure 26A:
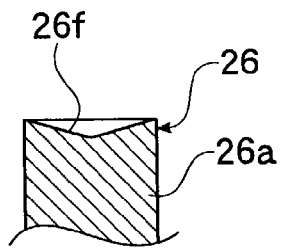
FIG. 26A is a sectional view thereof and FIG. 26B is a plan view thereof.
Figure 26B:
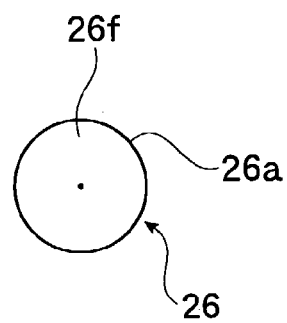
Figure 27A:
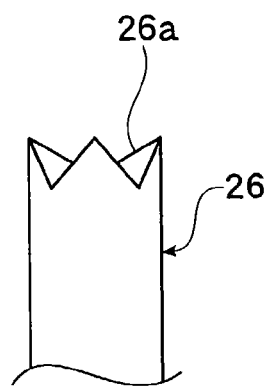
FIG. 27A is a front view thereof and FIG. 27B is a plan view thereof.
Figure 27B:
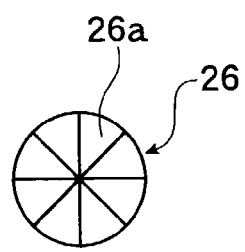
Figure 28A:
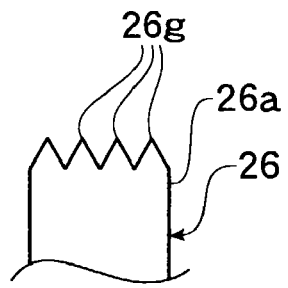
FIG. 28A is a front view thereof and FIG. 28B is a plan view thereof.
Figure 28B:
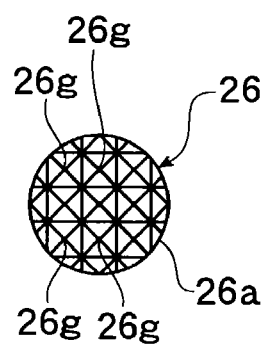
Figure 29:
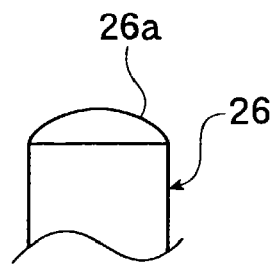
FIG. 29 shows a still further modification of the upper contact portion of the plunger of the contact pin of the respective embodiments.

Moreover, in the described embodiment, although the upper contact portion 26a of the plunger 26 has a conical shape, this portion may have another shape. For example, FIGS. 26A and 26B show an example having a conical recess 26f, FIGS. 27A and 27B show an example having so-called a crown shape, and FIGS. 28A and 28B show an example having a plurality of rectangular projections 26g. Furthermore, as shown in FIG. 29, the upper contact portion 26a of the plunger 26 may be formed to provide a spherical projection, and the end face may be formed to provide a flat surface.

The upper contact portion 26a, which may have a shape such as mentioned above, is preferably applicable to an IC package of BGA (Ball Grid Array) type or LGA (Land Grid Array) type.

Still furthermore, it is to be noted that the present invention is not limited to the described embodiments and many other changes and modifications may be made without departing from the scopes of the appended claims.

For example, the plunger 26 of the contact pin 15 may be manufactured by the press working and the bottom contact portion 27 may be formed into a rod shape, instead of the plunger, by the cut or grind working. Further, both may be manufactured by the press working.

Furthermore, although the contact pin 15 of the described embodiment is of the type in which the bottom contact portion 27 presses the surface of the printed circuit board P, in an alternation, the lower end of the bottom contact portion may be inserted into a through hole formed to the printed circuit board P and the inserted end is then soldered thereto.

Still furthermore, although, in the described embodiments, the present invention is applied to the IC socket 11 as "a socket for an electrical part", the present invention is also applicable to other devices without being limited to the described applications. Moreover, although the present invention is applied to so-called an open-top type IC socket, it is applicable to a clamshell type IC socket.

Furthermore, in the described structure, the contact pin assembly 16 has three plates 21, 22 and 23, but it may have only one plate or more than three plates.

What is claimed is:

1. A contact pin mounted to a socket body into which an electrical part is accommodated and adapted to electrically connect a terminal of the electrical part to a printed circuit board, said contact pin comprising:
   a plunger electrically contacting the electrical part;
   a bottom contact portion electrically connected to the printed circuit board; and
   a spring urging the plunger and the bottom contact portion so as to separate from each other, wherein
      at least one of the plunger and the bottom contact portion is formed by press-working a plate member, and
      one of the plunger and the bottom contact portion is provided with a connection portion to which the other one of the plunger and the bottom contact portion is connected to be relatively movable.

2. The contact pin according to claim 1, wherein said other one of the plunger and the bottom contact portion is the plunger and has a rod-shaped portion which is formed to be relatively slidable with respect to the connection portion of the bottom contact portion.

3. The contact pin according to claim 1, wherein said one of the plunger and the bottom contact portion provided with a connection portion is the bottom contact portion having the connection portion of a tubular structure positioned on an upper side of the plunger, and the bottom contact portion has a lower contact portion contacting the printed circuit board having a center line in alignment with a center line of the plunger.

4. The contact pin according to claim 1, wherein said other one of the plunger and the bottom contact portion has a portion projecting through the connection portion and a coming-off prevention portion is provided for the projecting portion.

5. The contact pin according to claim 1, wherein
said one of the plunger and the bottom contact portion provided with a connection portion is the bottom contact portion,
said other one of the plunger and the bottom contact portion is the plunger and has a flanged portion, and
said spring is disposed between the flanged portion of the plunger and the connection portion of the bottom contact portion.

6. The contact pin according to claim 5, wherein at least one of the flanged portion and connection portion has an inclined surface to which the spring is contacted.

7. A socket for an electrical part having a socket body to which the electrical part is accommodated and to which the contact pin according to claim 1 is arranged to electrically connect a terminal of the electrical part to a printed circuit board, said socket body is provided with a frame-shaped base member, and a contact pin assembly, including the contact pin, mounted to be detachably thereto, said contact pin assembly being inserted, to be detachable, from an upper portion with respect to the base member.

8. The socket for an electrical part according to claim 7, wherein said contact pin assembly is mounted to a predetermined position with respect to the printed circuit board and said base member is arranged to be horizontally adjustable in position with respect to the contact pin assembly.

9. A socket for an electrical part having a socket body to which the electrical part is accommodated and to which the contact pin according to claim 1 is arranged to electrically connect a terminal of the electrical part to a printed circuit board, said socket body is provided with a frame-shaped base member, a contact pin assembly, including the contact pin, mounted to be detachably thereto, and a lock means for securing the contact pin assembly to the base member, said lock means being operated from an upper side thereof.

10. The socket for an electrical part according to claim 9, wherein said contact pin assembly includes top, middle and bottom plates disposed vertically, said bottom and middle plates being arranged with a predetermined distance, said top plate being disposed to be vertically movable with respect to said middle plate and being urged upward.

11. The socket for an electrical part according to claim 10, wherein said middle plate is positioned in the vertical direction with respect to the base member.

12. A socket for an electrical part having a socket body to which the contact pin according to claim 1 is arranged, wherein said socket body has an upper portion to which a top plate is disposed and a lower portion to which a bottom plate is disposed, the plunger of the contact pin has a flanged portion which is inserted through the top plate to be vertically movable and the bottom contact portion is inserted through the bottom plate.

13. The socket for an electrical part according to claim 12, wherein said plunger has an upper coming-off prevention portion which abuts against a lower surface of the top plate and said bottom contact portion has a lower coming-off prevention portion which abuts against an upper surface of the bottom plate to thereby restrict vertical movement of the contact pin.

14. The socket for an electrical part according to claim 12, wherein a middle plate is further arranged between the top plate and the bottom plate, and the connection portion is inserted and guided through the middle plate so as to be vertically movable.

15. The socket for an electrical part according to claim 14, wherein said bottom contact portion is formed with a connection portion, to which an engaging piece is formed so as to limit an upward movement of the bottom contact portion in engagement with a lower surface of the middle plate.

16. A socket for an electrical part for establishing an electrical connection between a terminal of the electrical part and a printed circuit board, comprising:
a socket body to which a number of contact pins are arranged;
a base member disposed to the socket body;
a contact pin assembly provided with the contact pin and secured to the base member by a lock means;
an open/close member arranged to the base member to be rotatable; and
an operation member operating the open/close member to be rotatable,
said contact pin assembly including a plurality of plates disposed vertically within a predetermined distance, and
said contact pin comprising a plunger electrically contacting the electric part, a bottom contact portion electrically connected to the printed circuit board, and a spring urging the plunger and the bottom contact portion so as to separate from each other, wherein at least one of the plunger and the bottom contact portion is formed by press-working a plate member, said bottom contact portion being provided with a connection portion to which the plunger is connected, and said plunger having a rod-shaped portion which is formed to be relatively slidable to the connection portion of the bottom contact portion.

17. A socket for an electrical part having a socket body to which the electrical part is accommodated and to which a contact pin is arranged to electrically connect a terminal of the electrical part to a printed circuit board, said socket body is provided with a frame-shaped base member, a contact pin assembly, including the contact pin, mounted to be detachably thereto, and a lock means for securing the contact pin assembly to the base member, said lock means being operated from an upper side thereof,
wherein said contact pin assembly includes top, middle and bottom plates disposed vertically, said bottom and middle plates being arranged within a predetermined distance, said top plate being disposed to be vertically movable with respect to said middle plate and being urged upward.

18. The socket for an electrical part according to claim 17, wherein said middle plate is positioned in the vertical direction with respect to the base member.

* * * * *